(12) United States Patent  
Ching et al.

(10) Patent No.: US 9,922,978 B2  
(45) Date of Patent: Mar. 20, 2018

(54) SEMICONDUCTOR STRUCTURE WITH RECESSED SOURCE/DRAIN STRUCTURE AND METHOD FOR FORMING THE SAME

(71) Applicant: TAIWAN SEMICONDUCTOR MANUFACTURING CO., LTD, Hsin-Chu (TW)

(72) Inventors: Kuo-Cheng Ching, Zhubei (TW); Ching-Wei Tsai, Hsinchu (CN); Ying-Keung Leung, Hsinchu (TW)

( * ) Notice: Subject to any disclaimer, the term of this patent is extended or adjusted under 35 U.S.C. 154(b) by 0 days.

(21) Appl. No.: 14/832,086

(22) Filed: Aug. 21, 2015

(65) Prior Publication Data

US 2017/0053916 A1 Feb. 23, 2017

(51) Int. Cl.
| | |
|---|---|
| H01L 27/092 | (2006.01) |
| H01L 29/417 | (2006.01) |
| H01L 21/8238 | (2006.01) |
| H01L 29/08 | (2006.01) |
| H01L 29/66 | (2006.01) |
| H01L 29/45 | (2006.01) |

(52) U.S. Cl.
CPC .. *H01L 27/0924* (2013.01); *H01L 21/823821* (2013.01); *H01L 21/823871* (2013.01); *H01L 29/0847* (2013.01); *H01L 29/41766* (2013.01); *H01L 29/41791* (2013.01); *H01L 29/45* (2013.01); *H01L 29/665* (2013.01); *H01L 29/6653* (2013.01); *H01L 21/823814* (2013.01)

(58) Field of Classification Search
None
See application file for complete search history.

(56) References Cited

U.S. PATENT DOCUMENTS

| | | | | |
|---|---|---|---|---|
| 8,703,556 | B2* | 4/2014 | Kelly | H01L 29/66795 257/296 |
| 2011/0133285 | A1* | 6/2011 | Liaw | H01L 27/0207 257/368 |
| 2011/0298058 | A1* | 12/2011 | Kawasaki | H01L 29/7853 257/401 |
| 2013/0221414 | A1* | 8/2013 | Zhao | H01L 29/66795 257/288 |
| 2013/0234250 | A1* | 9/2013 | Lin | H01L 21/823431 257/355 |

(Continued)

FOREIGN PATENT DOCUMENTS

| | | | | |
|---|---|---|---|---|
| KR | 1020150020290 | * | 2/2015 | ............ H01L 29/78 |
| TW | 200919726 A | | 5/2009 | |

OTHER PUBLICATIONS

U.S. Appl. No. 14/700,202, filed Apr. 30, 2015, Wang.

*Primary Examiner* — Michael Lebentritt
*Assistant Examiner* — Jordan Klein
(74) *Attorney, Agent, or Firm* — Birch, Stewart, Kolasch & Birch, LLP

(57) ABSTRACT

A semiconductor structure and a method for forming the same are provided. The semiconductor structure includes a fin structure formed over a substrate and a first gate structure formed across the fin structure. The semiconductor structure further includes a first source/drain structure formed in the fin structure adjacent to the first gate structure and a first contact formed over the first source/drain structure. In addition, the first contact includes a first extending portion extending into the first source/drain structure.

20 Claims, 31 Drawing Sheets

(56) References Cited

U.S. PATENT DOCUMENTS

| | | | |
|---|---|---|---|
| 2014/0061734 A1* | 3/2014 | Basker | H01L 29/66795 257/288 |
| 2014/0203370 A1* | 7/2014 | Maeda | H01L 29/785 257/365 |
| 2015/0035023 A1* | 2/2015 | Kim | H01L 29/785 257/288 |
| 2015/0041918 A1* | 2/2015 | Wann | H01L 29/785 257/401 |
| 2015/0079751 A1* | 3/2015 | Alptekin | H01L 29/785 438/283 |
| 2015/0084134 A1* | 3/2015 | Lin | H01L 21/823431 257/384 |
| 2015/0221654 A1* | 8/2015 | Kim | H01L 27/11 257/77 |
| 2015/0270177 A1* | 9/2015 | Tseng | H01L 21/823857 438/216 |
| 2016/0126343 A1 | 5/2016 | Ching et al. | |
| 2016/0233164 A1* | 8/2016 | Choi | H01L 27/0924 |

* cited by examiner

SEMICONDUCTOR STRUCTURE WITH RECESSED SOURCE/DRAIN STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
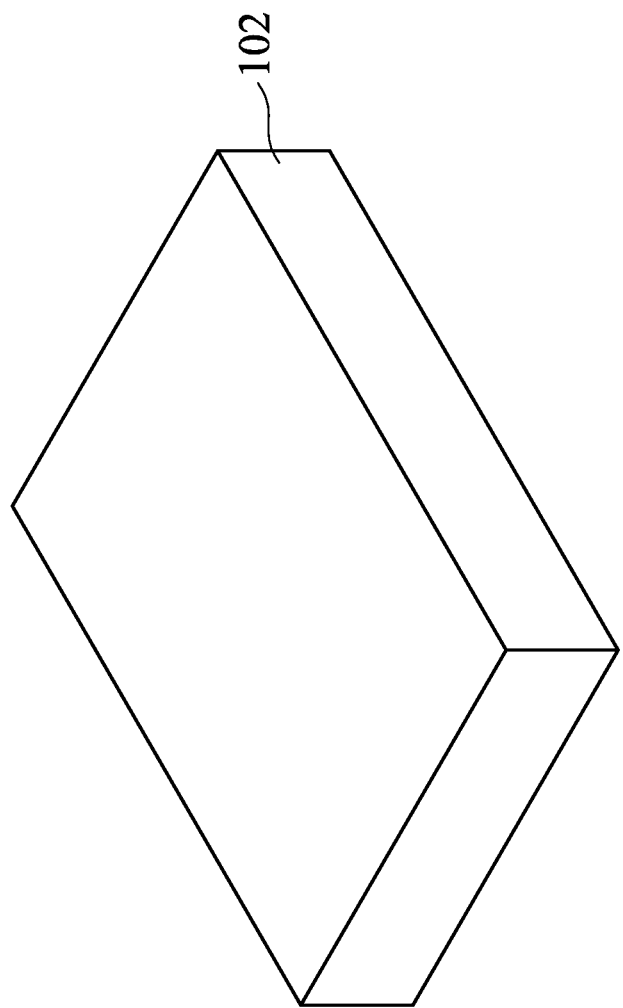
FIGS. 1A to 1Q are perspective views of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a gate structure and a source/drain structure formed adjacent to the gate structure. In addition, a recess is formed in the source/drain structure, and a silicide is formed on the sidewalls and the bottom surface of the recess in accordance with some embodiments. Afterwards, a contact is formed over the source/drain structure and an extending portion is formed in the recess, so that the silicide layer can have a relatively large contact area.

Figure 1B:
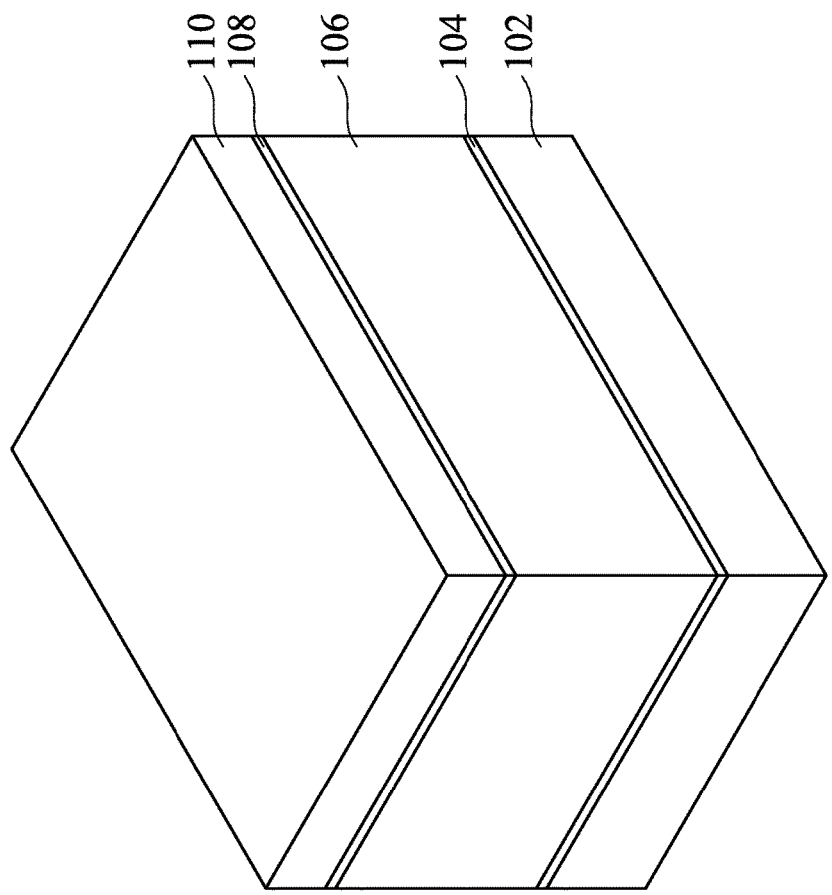
Figure 1C:
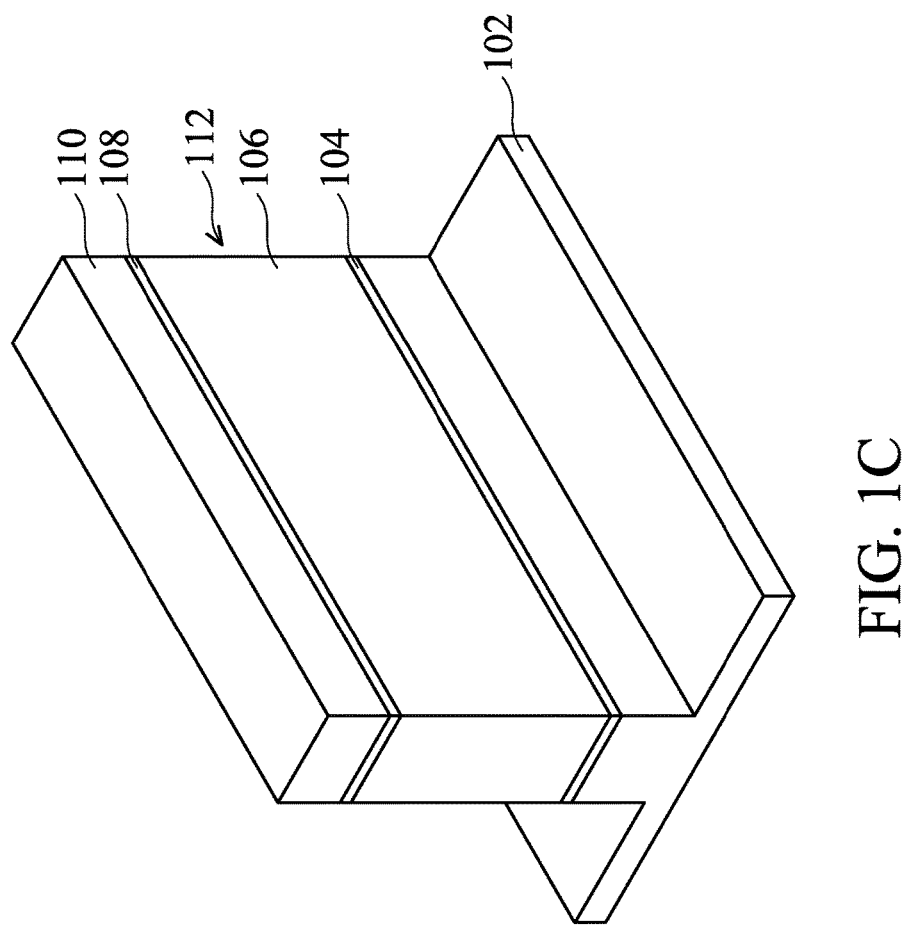
Figure 1D:
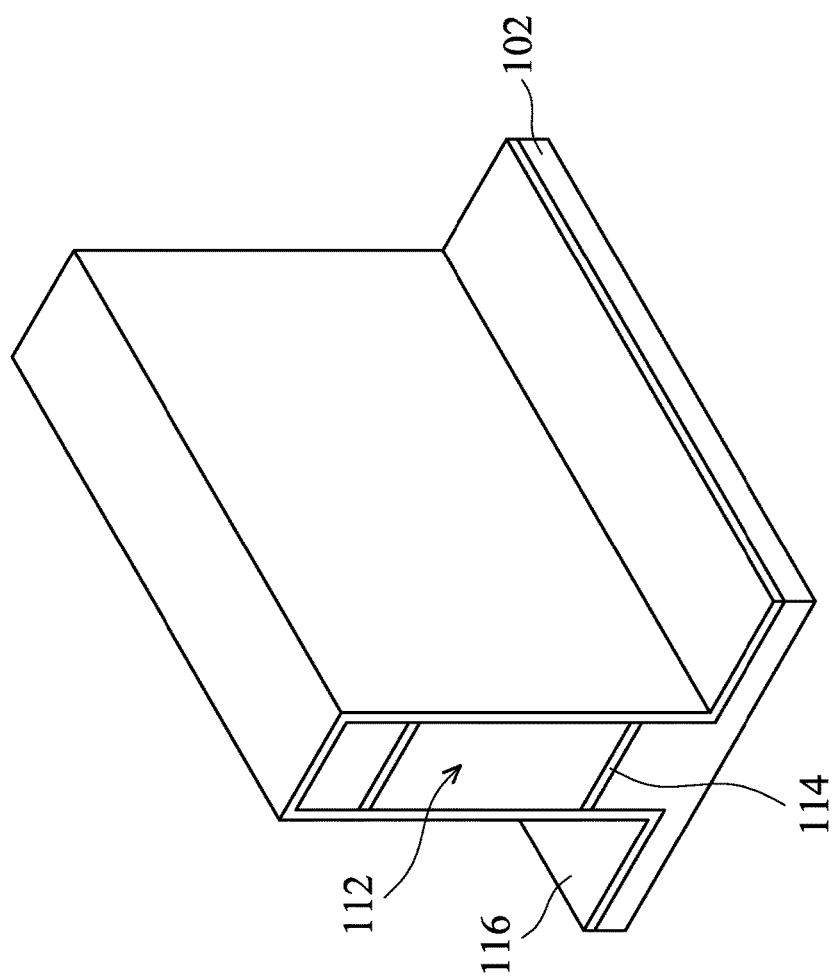
Figure 1E:
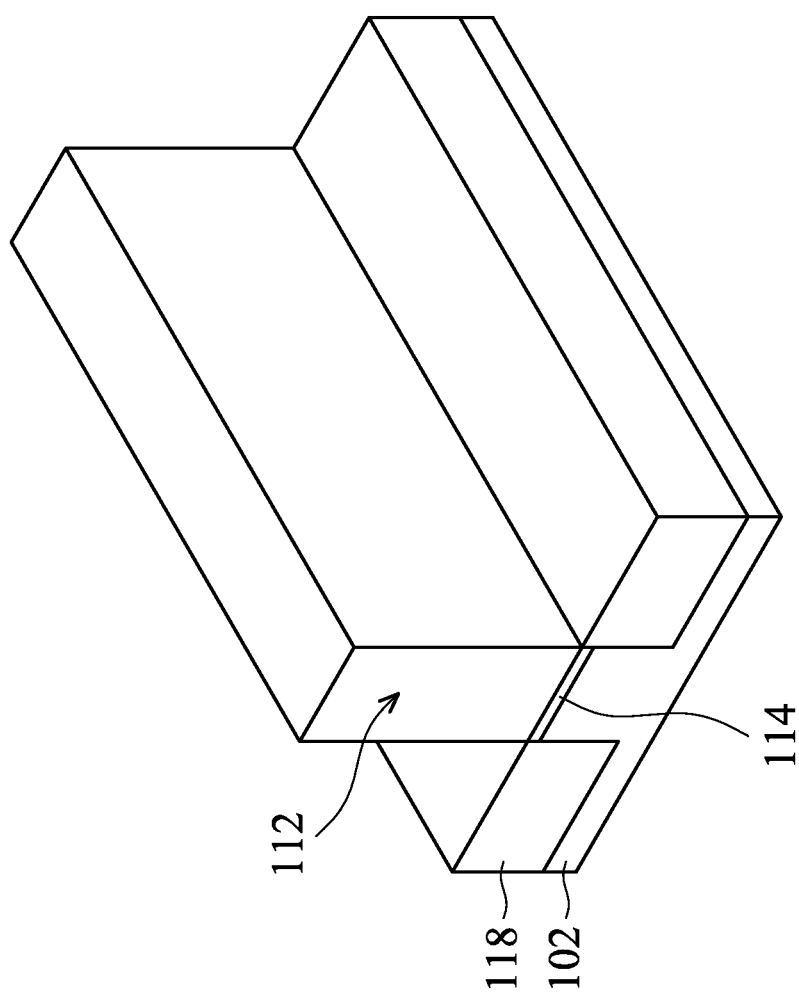
Figure 1F:
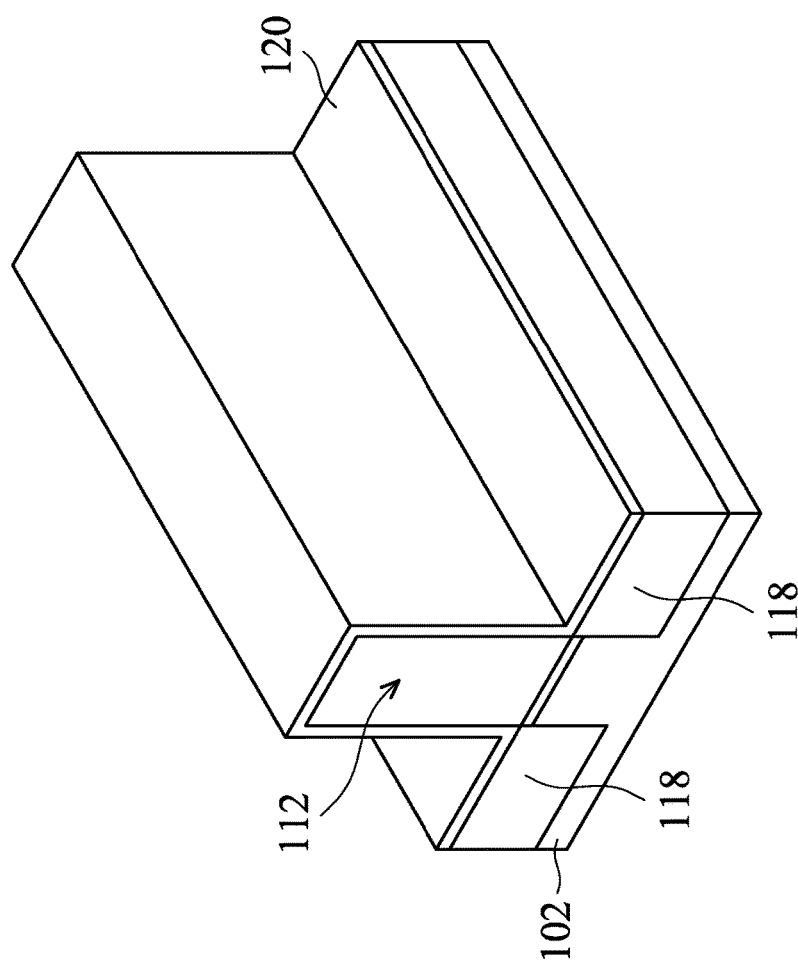
Figure 1G:
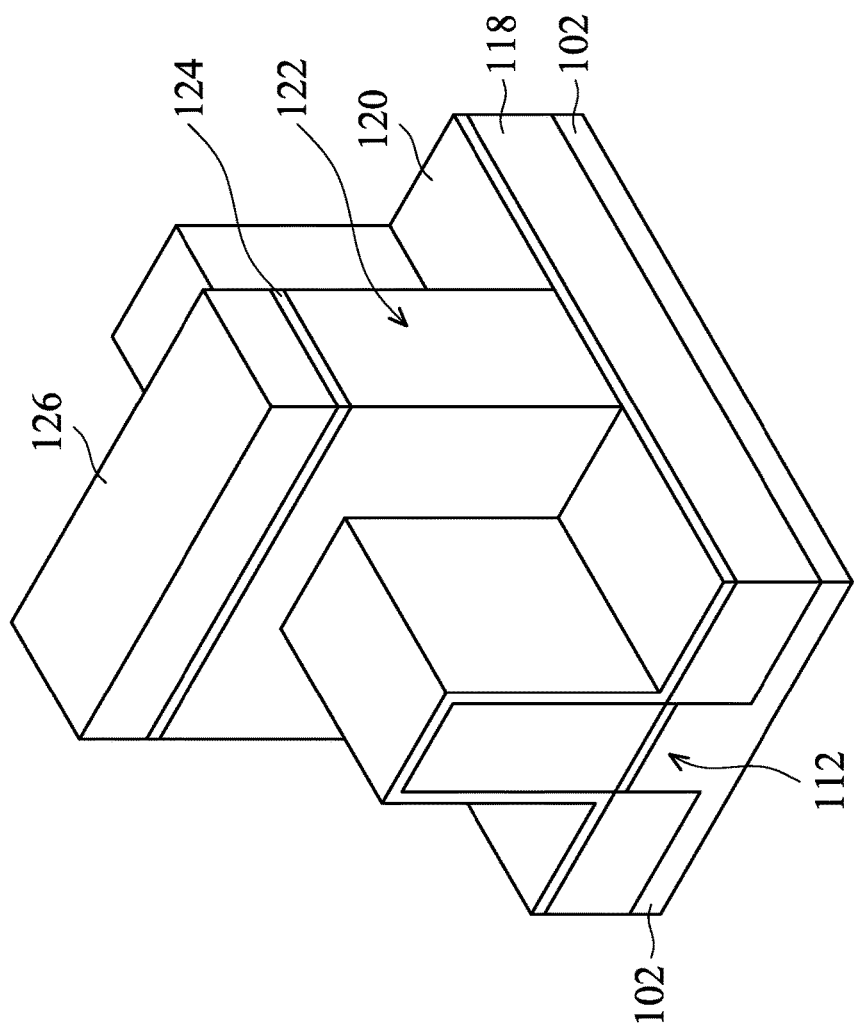
Figure 1H:
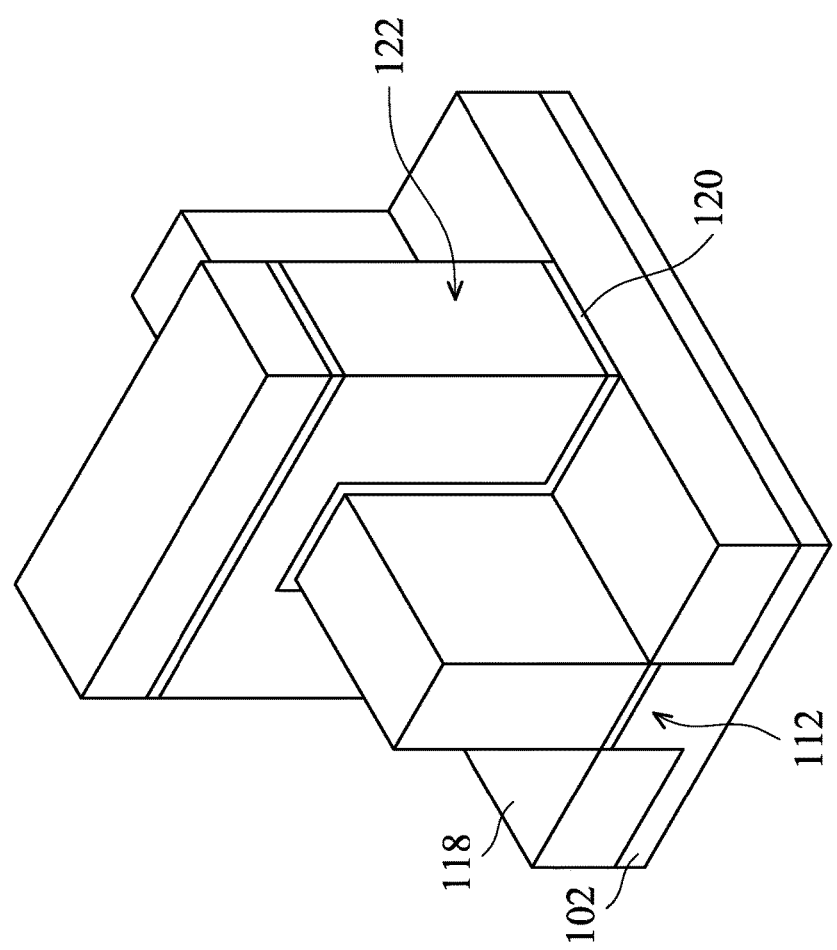
Figure 1I:
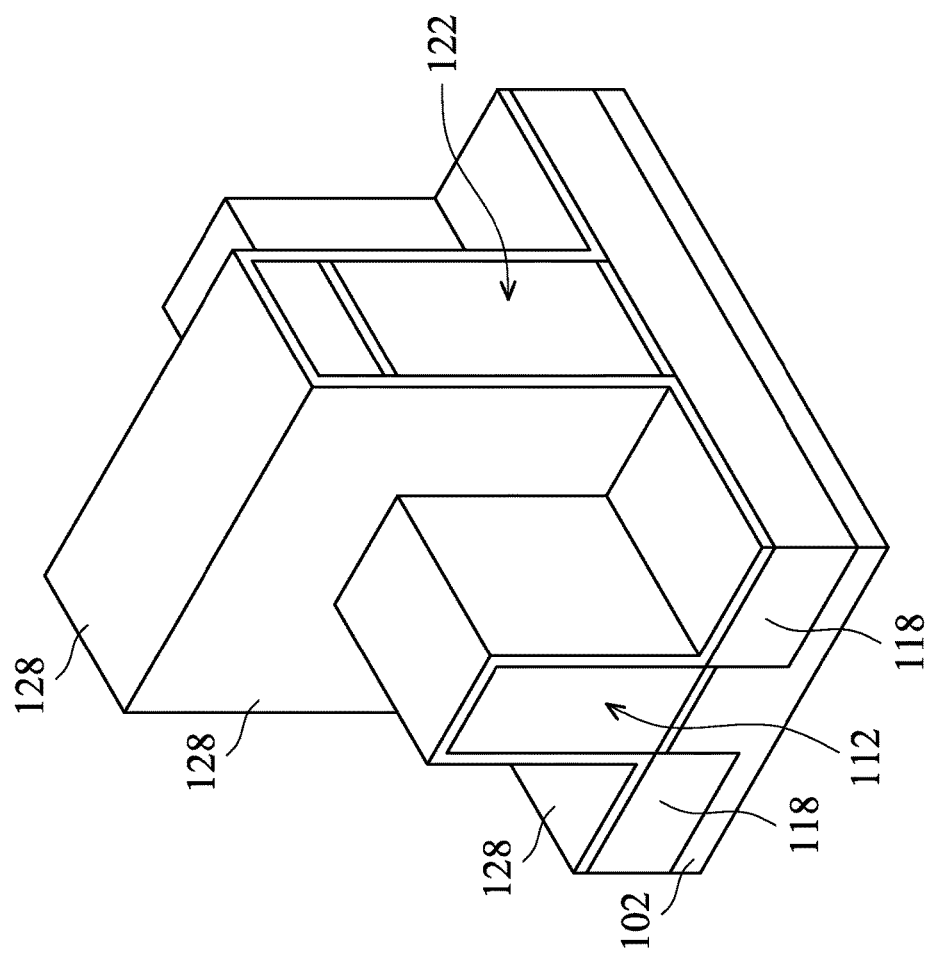
Figure 1J:
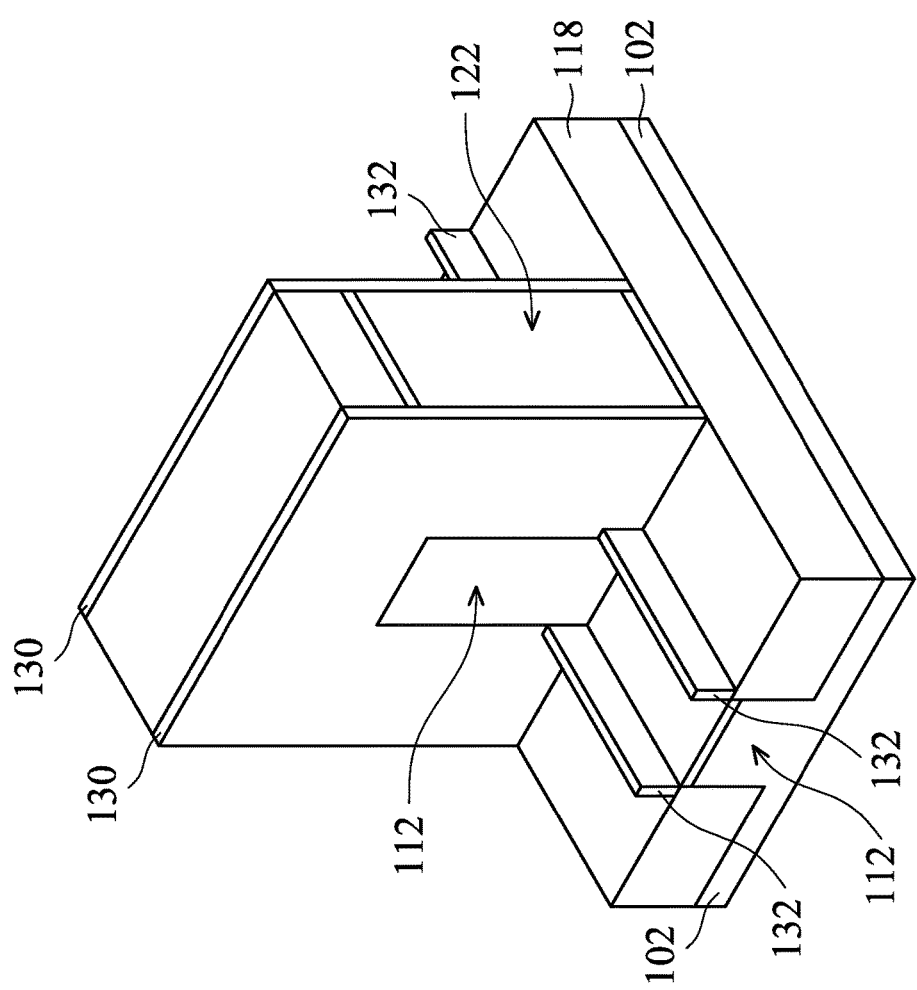
Figure 1K:
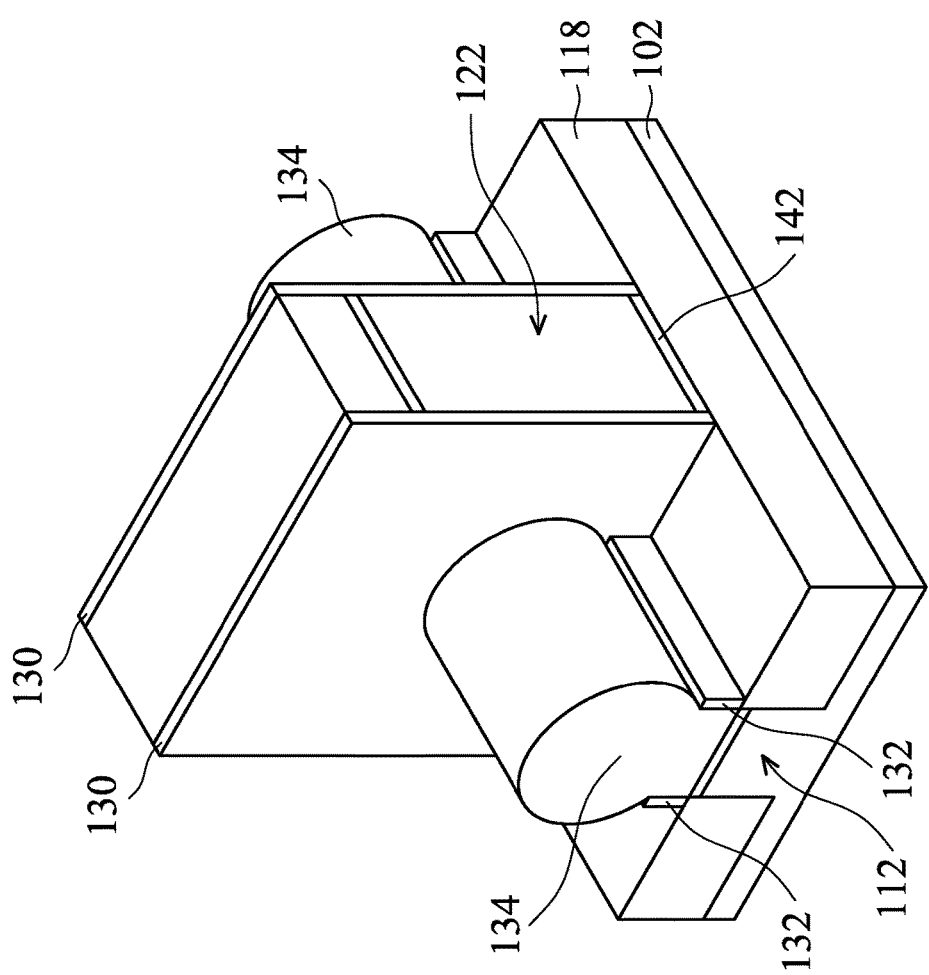
Figure 1L:
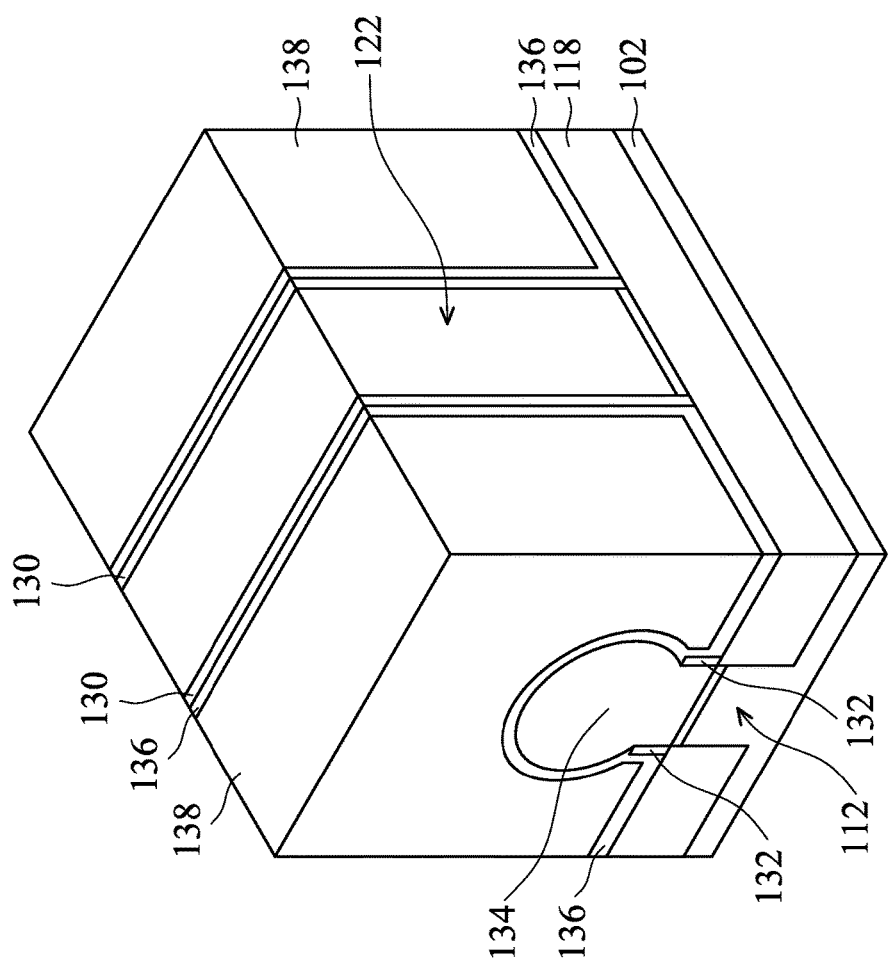
Figure 1M:
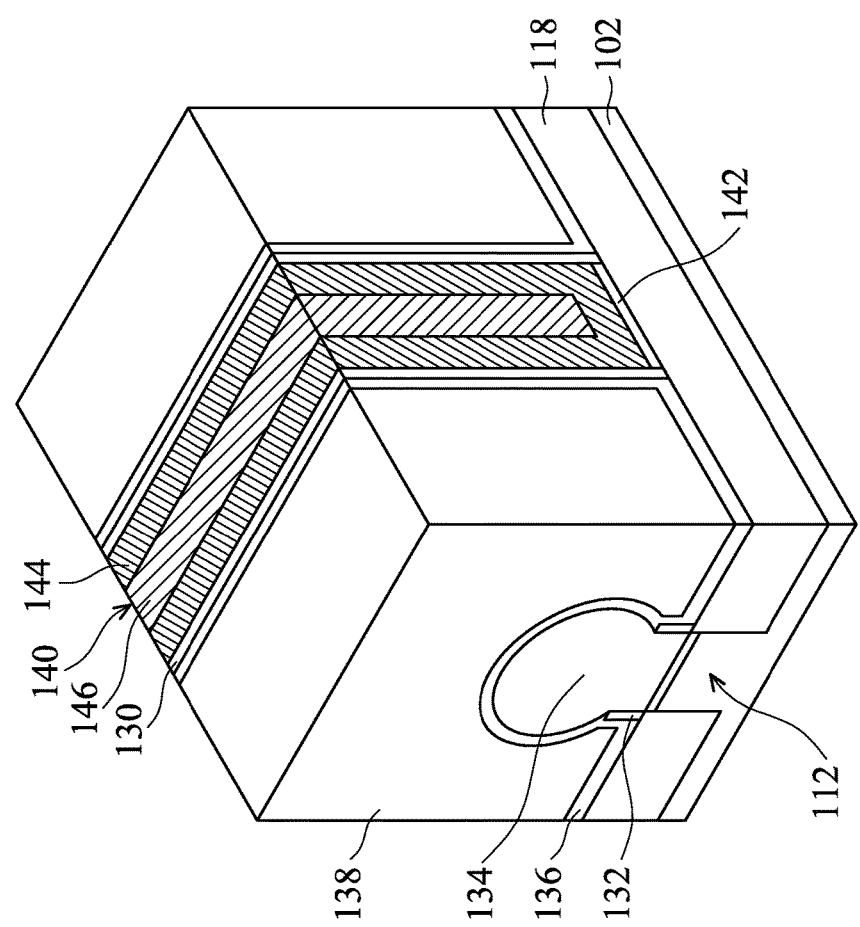
Figure 1N:
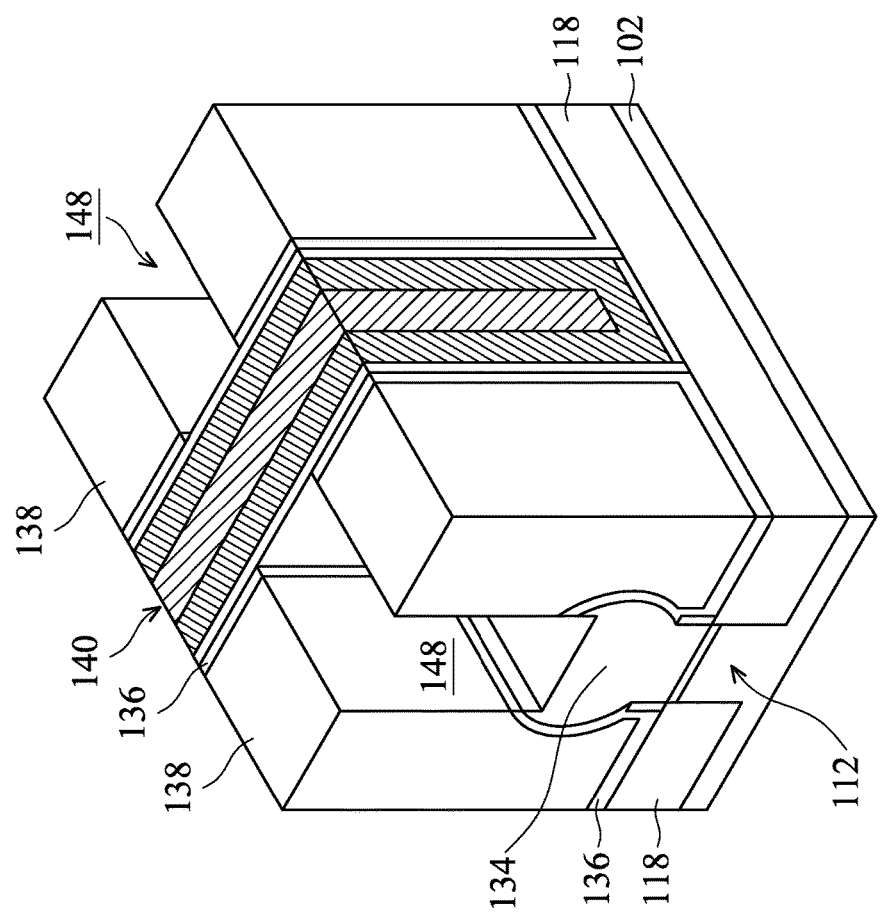
Figure 1O:
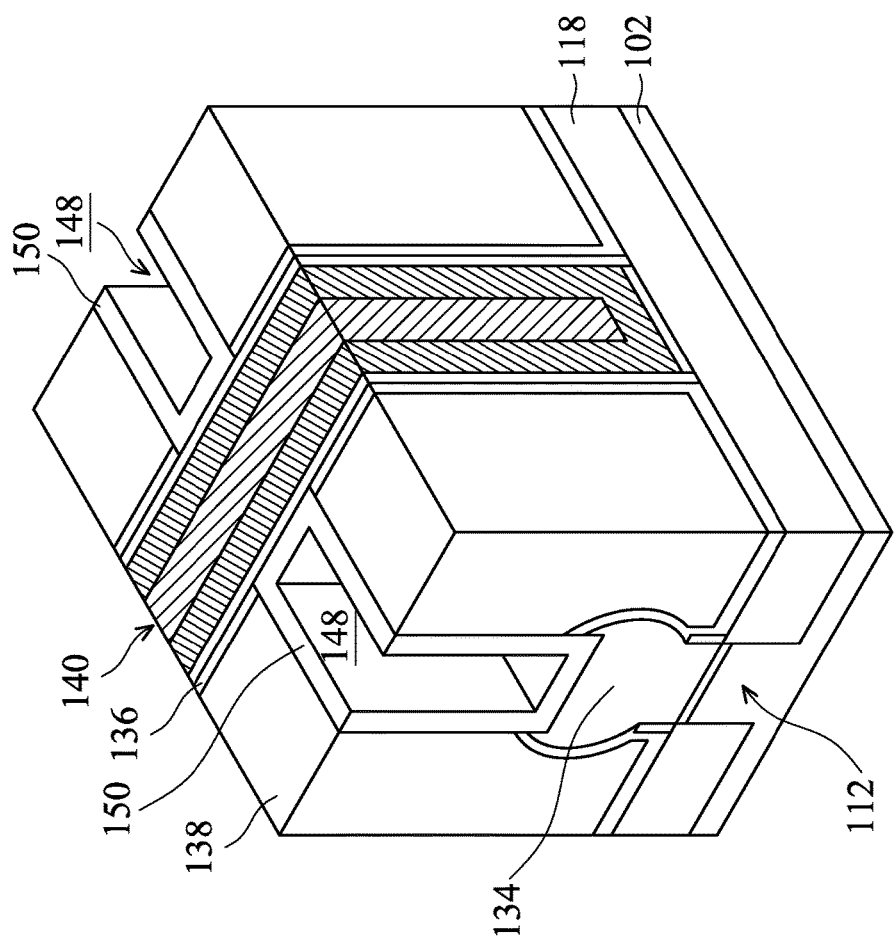
Figure 1P:
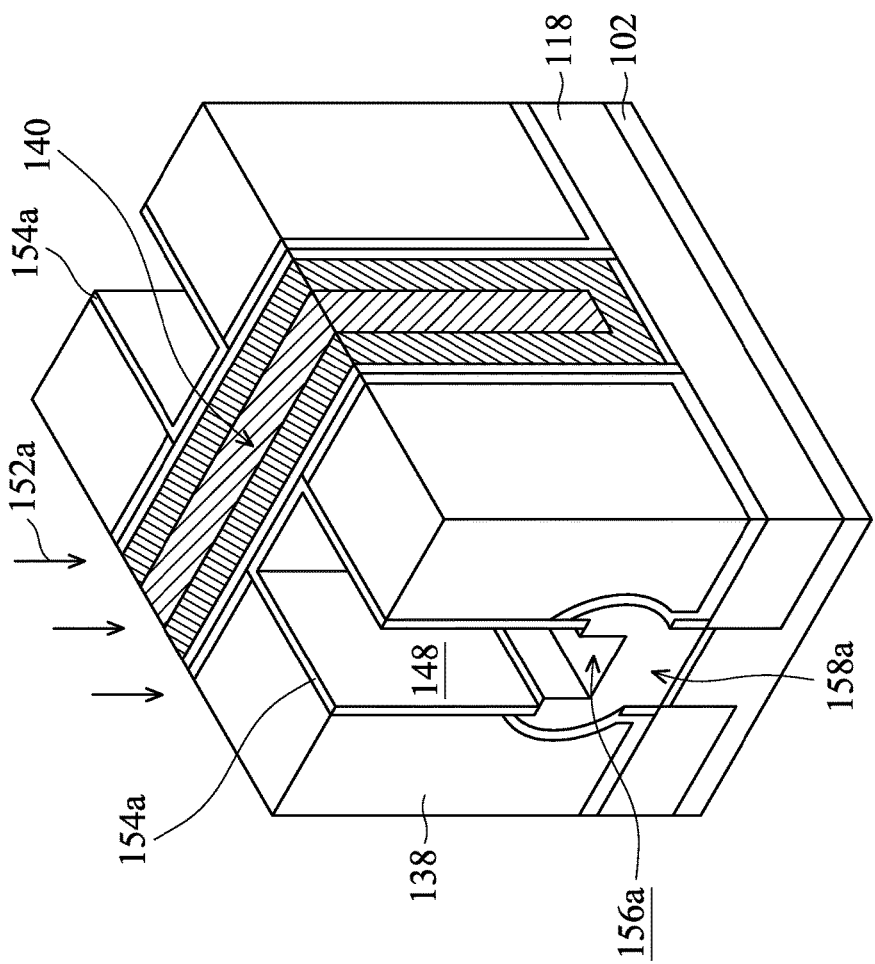
Figure 1Q:
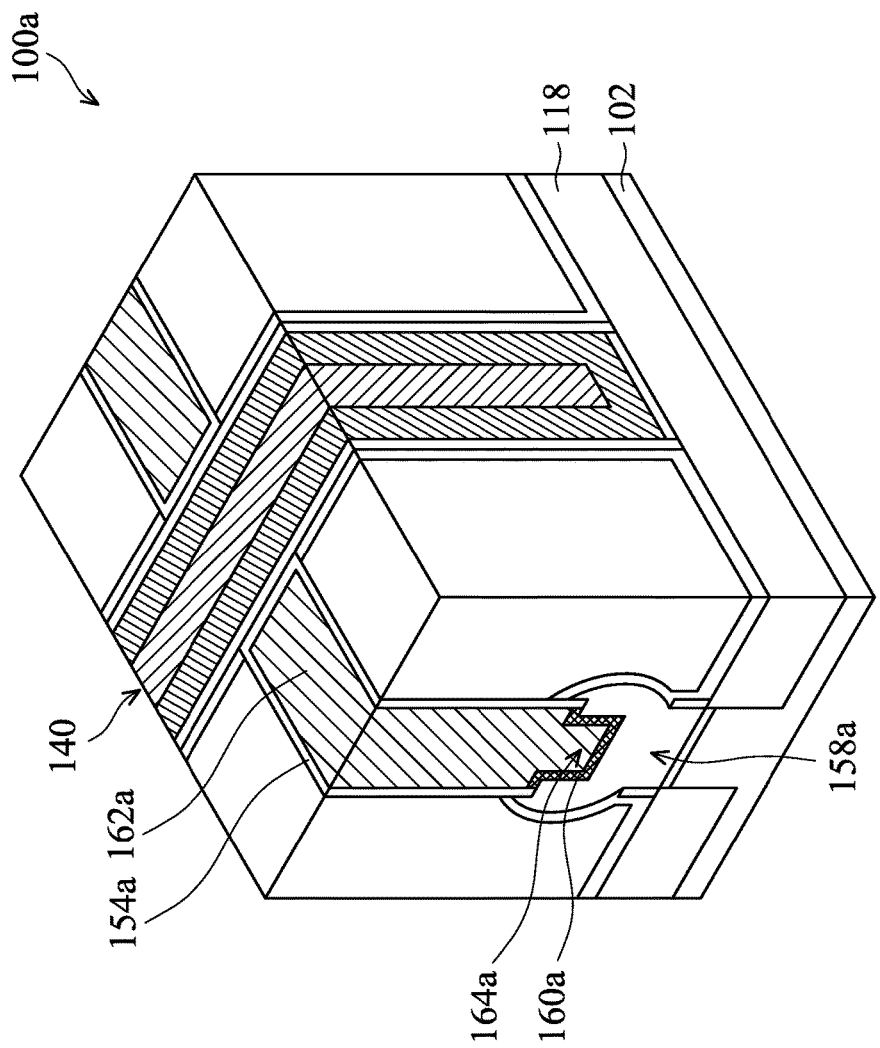

FIGS. 1A to 1Q are perspective views of various stages of forming a semiconductor structure 100a in accordance with some embodiments. In some embodiments, semiconductor structure 100a is a p-type metal-oxide-semiconductor (PMOS) structure. As shown in FIG. 1A, a substrate 102 is received in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A SiGe layer 104, a Si layer 106, a dielectric layer 108, and a mask layer 110 are sequentially formed over substrate 102, as shown in FIG. 1B in accordance with some embodiments. SiGe layer 104 and Si layer 106 may be formed by epitaxial (epi) processes. Dielectric layer 108 may be used as an adhesion layer between Si layer 106 and mask layer 110. In addition, dielectric layer 108 may also be used as an etch stop layer for etching mask layer 110. In some embodiments, dielectric layer 108 is made of silicon oxide. Dielectric layer 108 may be formed by using a thermal oxidation process, although other deposition processes may be used in some other embodiments.

Mask layer 110 may be used as a hard mask during subsequent photolithography processes. In some embodiments, mask layer 110 is made of silicon nitride. Mask layer 110 may be formed by using low-pressure chemical vapor deposition (LPCVD) or plasma enhanced chemical vapor deposition (PECVD), although other deposition processes may also be used in some other embodiments.

Next, a fin structure 112 is formed by patterning mask layer 110, dielectric layer 108, Si layer 106, SiGe layer 104, and substrate 102, as shown in FIG. 1C in accordance with some embodiments. In some embodiments, fin structure 112 is formed by forming a photoresist layer over mask layer 110 and sequentially etching mask layer 110, dielectric layer 108, Si layer 106, SiGe layer 104, and substrate 102.

After fin structure 112 is formed, an oxidation process is performed so that SiGe layer 104 is oxidized to form $SiGeO_x$ layer 114, as shown in FIG. 1D in accordance with some embodiments. In addition, an oxide layer 116 is formed to cover fin structure 112 and substrate 102 in accordance with some embodiments. As shown in FIG. 1D, oxide layer 116 is formed on the top surface and the sidewalls of fin structure 112 and on the top surface of substrate 102.

After the oxidation process is performed, an isolation structure 118 is formed over substrate 102, and fin structure 112 is surrounded by isolation structure 118, as shown in FIG. 1E in accordance with some embodiments. In addition, dielectric layer 108 and mask layer 110 are removed.

Isolation structure 118 may be formed by depositing an insulating layer over substrate 102 and recessing the insulating layer. In some embodiments, isolation structure 118 is made of silicon oxide, silicon nitride, silicon oxynitride, fluoride-doped silicate glass (FSG), or other low-K dielectric materials. In some embodiments, isolation structure 118 is made of an oxide that is the same as that used to form oxide layer 116, and therefore oxide layer 116 can be seen as a portion of isolation structure 118 and is not shown in the figures hereafter.

Next, a gate dielectric layer 120 is formed over substrate 102 to cover fin structure 112 and isolation structure 118, as shown in FIG. 1F in accordance with some embodiments. In some embodiments, gate dielectric layer 120 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HrZrO), zirconium oxide, titanium oxide, aluminum oxide, hafnium dioxide-alumina ($HfO_2$—$Al_2O_3$) alloy, or other applicable dielectric materials.

Afterwards, a dummy gate structure 122 is formed across fin structure 112 and extends over isolation structure 118, as shown in FIG. 1G in accordance with some embodiments. In some embodiments, dummy gate structure 122 is made of polysilicon. In some embodiments, a dielectric layer 124 and a mask layer 126 are positioned over dummy gate structure 122. Materials and methods used to form dielectric layer 124 and mask layer 126 may be similar to those used to made dielectric layer 108 and mask layer 110 and are not repeated herein.

Next, the portions of gate dielectric layer 120 which are not covered by dummy gate structure 112 are removed, as shown in FIG. 1H in accordance with some embodiments. Afterwards, a spacer layer 128 is formed over substrate 102 to cover dummy gate structure 122, fin structure 112, and isolation structure 118, as shown in FIG. 1I in accordance with some specification. In some embodiments, spacer layer 128 is made of silicon nitride, silicon oxide, silicon oxynitride, silicon carbide, or other applicable dielectric materials. Spacer layer 128 may include a single layer or multiple layers.

After spacer layer 128 is formed, an etching process is performed to form gate spacers 130 on the sidewalls of dummy gate structure 122 and to form fin spacers 132 on the sidewalls of fin structure 112, as shown in FIG. 1J in accordance with some embodiments. The etching process may be a wet etching process.

After gate spacers 130 and fin spacers 132 are formed, the portions of fin structure 112 which are not covered by dummy gate structure 122 are recessed, as shown in FIG. 1J in accordance with some embodiments. That is, recesses are formed between fin spacer 132. In some embodiments, the portions of fin structure 112 are recessed until $SiGeO_x$ layer 114 is exposed.

After the recesses are formed in fin structure 112, source/drain structures 134 are formed in the recesses, as shown in FIG. 1K in accordance with some embodiments. In some embodiments, source/drain structures 134 are formed by growing a strained material in the recesses by an epitaxial (epi) process. In addition, the lattice constant of the strained material may be different from the lattice constant of substrate 102. In some embodiments, source/drain structures 134 are made of Ge, SiGe, InAs, InGaAs, InSb, GaAs, GaSb, InAlP, InP, or the like. In some embodiments, source/drain structures 134 includes Ge in a concentration of about 50% to about 100%. In some embodiments, source/drain structures 134 includes B as a dopant in a concentration of about $5 \times 10^{20}$ atoms/cm$^3$ to about $2 \times 10^{21}$ atoms/cm$^3$.

After source/drain structures 134 are formed, a contact etch stop layer (CESL) 136 is formed over substrate 102, and an inter-layer dielectric (ILD) layer 138 is formed over contact etch stop layer 126, as shown in FIG. 1L in accordance with some embodiments.

In some embodiments, contact etch stop layer 136 is made of silicon nitride, silicon oxynitride, and/or other applicable materials. Contact etch stop layer 136 may be formed by plasma enhanced CVD, low pressure CVD, ALD, or other applicable processes. Interlayer dielectric layer 138 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. Interlayer dielectric layer 138 may be formed by chemical vapor deposition (CVD), physical vapor deposition, (PVD), atomic layer deposition (ALD), spin-on coating, or other applicable processes.

After contact etch stop layer 136 and interlayer dielectric layer 138 are formed, a polishing process is performed until the top surface of dummy gate structure 122 is exposed, as shown in FIG. 1L in accordance with some embodiments. In some embodiments, a chemical mechanical polishing (CMP) process is performed.

After the polishing process is performed, dummy gate structure 122 is replaced by a gate structure 140, as shown in FIG. 1M in accordance with some embodiments. Gate structure 140 may be formed by removing gate dielectric layer 120 and dummy gate structure 122 to form a trench and forming gate structure 140 in the trench. It should be noted that, although gate dielectric layer 120 is removed in FIG. 1M, it may not be removed in some other embodiments.

In some embodiments, gate structure 140 includes a gate dielectric layer 142, a work function metal layer 144, and a gate electrode layer 146. In some embodiments, gate dielectric layer 142 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO$_2$—Al$_2$O$_3$) alloy, or other applicable dielectric materials.

Work function metal layer 144 is formed over gate dielectric layer 142 in accordance with some embodiments. Work function metal layer 144 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Gate electrode layer 146 is formed over work function metal layer 144 in accordance with some embodiments. In some embodiments, gate electrode layer 146 is made of a conductive material, such as aluminum, copper, tungsten, titanium, tantalum, or other applicable materials. Gate dielectric layer 142, work function metal layer 144, and gate electrode layer 146 may be formed by any applicable process to any applicable thickness.

It should be noted that additional layers may be formed above and/or below gate dielectric layer 142, work function metal layer 144, and gate electrode layer 146, such as liner layers, interface layers, seed layers, adhesion layers, barrier layers, or the like. In addition, gate dielectric layer 142, work function metal layer 144, and gate electrode layer 146 may include more than one layer made of various materials.

After gate structure 140 is formed, trenches 148 are formed in interlayer dielectric layer 138, as shown in FIG. 1N in accordance with some embodiments. In some embodiments, trench 148 is formed by etching a portion of interlayer dielectric layer 138 to form a trench over source/drain structure 134 and etching contact etch stop layer 136 through the trench. In some embodiments, a top portion of source/drain structure 134 is also removed, such that trench 148 extends into source/drain structure 134.

After trench 148 is formed, a contact spacer layer 150 is formed on the sidewalls and the bottom surface of trench 148, as shown in FIG. 1O in accordance with some embodiments. In some embodiments, contact spacer layer 150 is made of silicon nitride, silicon oxide, silicon oxynitride, silicon carbide, or other applicable dielectric materials. In some embodiments, the thickness of contact spacer layer 150 is in a range from about 2 nm to about 5 nm. If contact spacer layer 150 is not thick enough, it may be completely removed in a subsequent etching process. On the other hand, if contact spacer layer 150 is too thick, it may become difficult for a contact to form therein (Details will be described later.)

After contact spacer layer 150 is formed, a first etching process 152a is performed, as shown in FIG. 1P in accordance with some embodiments. In some embodiments, first etching process 152a is a dry etching process. During first etching process 152a, contact spacer layer 150 is etched to form first contact spacer 154a, and source/drain structure 134 is etched to form a first recess 156a in a recessed source/drain structure 158a, as shown in FIG. 1P.

After first recess 154a is formed in first recessed source/drain region 158a, a first silicide layer 160a is formed over first recess 154a, as shown in FIG. 1Q in accordance with some embodiments. First silicide layer 160a may be formed by forming a metal layer on recessed source/drain structure 158a, reacting the metal layer and recessed source/drain structure 158a by performing a annealing process, and removing the unreacted metal layer.

As shown in FIG. 1Q, first silicide layer 160a is formed over the top portion of recessed source/drain structure 158a which is exposed by trench 148 and first recess 156a. In some embodiments, first silicide layer 160a has a step-like shape. In some embodiments, first silicide layer 160a is formed on the sidewalls and the bottom surface of first recess 156a. In addition, in some embodiments, first silicide layer 160a is also formed on a bottom surface of trench 148 (e.g. the portion of recessed source/drain structure 158a which is substantially level with the bottom surface of first contact spacer 154a) to form the top portion of a structure with a step-like shape.

After first silicide layer 160a is formed, a first contact 162a is formed over first recessed source/drain region 158a, as shown in FIG. 1Q in accordance with some embodiments. In some embodiments, first contact 162a includes aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, first contact 162a includes a titanium nitride layer and tungsten formed over the titanium nitride layer.

In addition, first contact 162a may include a liner and/or a barrier layer. For example, a liner (not shown) may be formed on the sidewalls and bottom of the contact trench. The liner may be made of silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Figure 2:
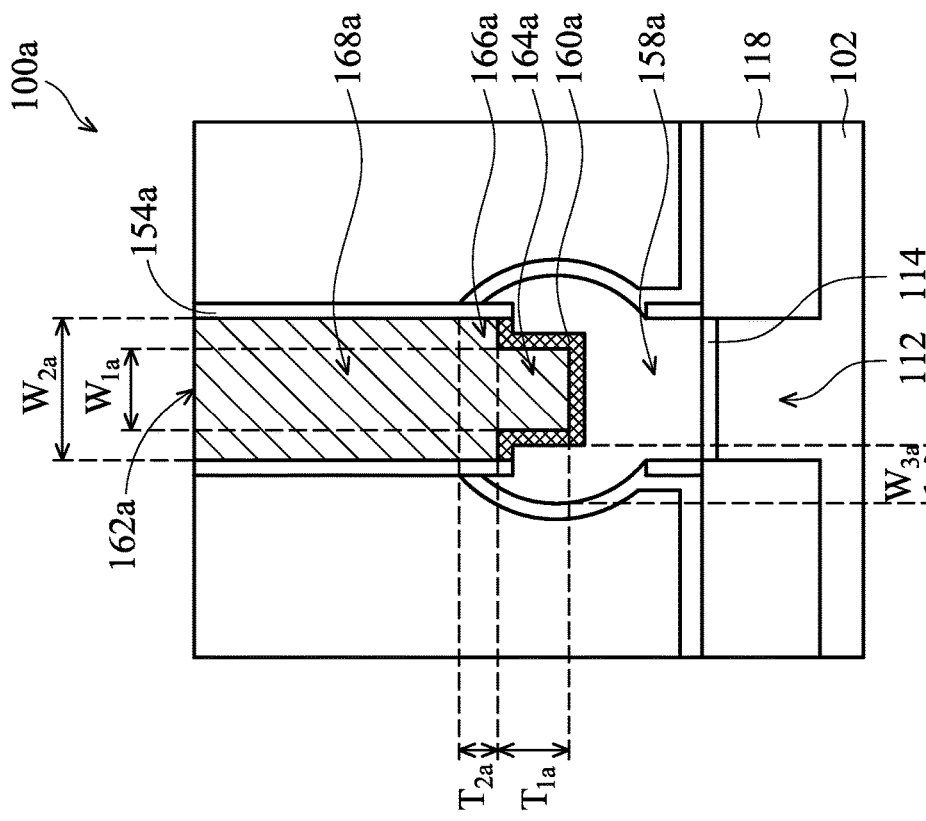
FIG. 2 is a cross-sectional representation of the semiconductor structure shown in FIG. 1Q in accordance with some embodiments.

FIG. 2 is a cross-sectional representation of semiconductor structure 100a shown in FIG. 1Q in accordance with some embodiments. As described previously, gate structure 140 is formed over substrate 102 and is positioned across fin structure 112. Source/drain structure 134 is formed in fin structure 112 and is positioned adjacent to the gate structure 140. Next, trench 148 is formed in interlayer dielectric layer 138, as shown in FIG. 1N. In addition, a portion of source/drain structure 134 is removed during the process for forming trench 148, such that a portion of trench 148 extends into source/drain structure 134. The portion of trench 148 extending into source/drain structure 134 has a thickness in a range from about 3 nm to about 15 nm in accordance with some embodiments.

After trench 148 is formed, first contact spacer 154a and first recess 156a are formed by forming contact spacer layer 150 and performing first etching process 152a afterwards. First contact spacer 154a is formed to prevent gate structure 140 from being damaged and to prevent too much of source/drain structure 134 from being removed during first etching process 152a. As shown in FIG. 1P, the bottom surface of first contact spacer 154a is substantially level with the bottom surface of trench 148. Accordingly, a portion of first contact spacer 154a also extends into recessed source/drain structure 158a in accordance with some embodiments.

Next, first silicide layer 160a is formed at the bottom surface and sidewalls of first recess 156a. In addition, a portion of first silicide 160a extends over onto the surface of recessed source/drain structure 158a which is substantially level with the bottom surface of first contact spacer 154a. In some embodiments, first silicide layer 160a has a profile with a step-like shape.

Afterwards, first contact 162a is formed over first silicide 160a over recessed source/drain structure 158a, and first contact 162a includes an extending portion 164a formed in first recess 156a. In addition, first contact 162a further includes a first middle portion 166a formed in the portion of trench 148 extending into recessed source/drain structure 158a and a first top portion 168a positioned over first middle portion 168a. As shown in FIG. 1P, the width of first recess 156a is smaller than that of trench 148, and therefore the width of extending portion 164a is smaller than the width of middle portion 166a. Accordingly, first contact 162a has a step-like shape.

As shown in FIG. 2, first extending portion 164a of first contact 162a has a width $W_{1a}$, and first middle portion 166a of first contact 162a has a width $W_{2a}$. In some embodiments, the width $W_{2a}$ of first middle portion 166a is greater than the width $W_{1a}$ of first extending portion 164a. In addition, the width of top portion 168a of first contact 162a is substantially equal to the width $W_{2a}$ of middle portion 166a in accordance with some embodiments.

In some embodiments, the width $W_{1a}$ of first extending portion 164a is in a range from about 5 nm to about 19 nm. In some embodiments, the width $W_{2a}$ of first middle portion 166a is in a range of about 6 nm to about 20 nm. In some embodiments, the difference between width $W_{1a}$ and width $W_{2a}$ is in a range from about 1 nm to about 8 nm.

In some embodiments, first extending portion 164a of first contact 162a has a thickness $T_{1a}$ in a range from about 13 nm to about 45 nm. In some embodiments, first middle portion 166a of first contact 162a has a thickness $T_{2a}$ in a range of about 3 nm to about 15 nm. In some embodiments, the difference between thickness $T_{1a}$ and thickness $T_{2a}$ is in a range from about 10 nm to about 30 nm.

Furthermore, as shown in FIG. 2, a portion of recessed source/drain structure 158a is positioned beside first extending portion 164a of first contact 162a. In some embodiments, the portion of recessed source/drain structure 158a positioned beside the bottom surface of first extending portion 164a has a width $W_{3a}$ in a range from about 2 nm to about 10 nm. As described previously, first contact spacer 154a is formed to protect some portions of source/drain structure 134 so that the size of the resulting recessed source/drain structure 158a can be better controlled.

In addition, first silicide layer 160a is positioned at sidewalls and the bottom surface of first extending portion 164a of first contact 162a. Since first silicide layer 160a also has a profile with a step-like shape, it can have a relatively large contact area with recessed source/drain structure 158a and first contact 162a. Accordingly, the performance of semiconductor structure 100a can therefore be improved.

It should be noted that, although first contact 162a has been divided into first top portion 168a, first middle portion 166a, and first extending portion 164a in FIG. 2, these portions are merely used to provide a better understanding of the concept of the disclosure, and there are no real interfaces between them.

Figure 3A:
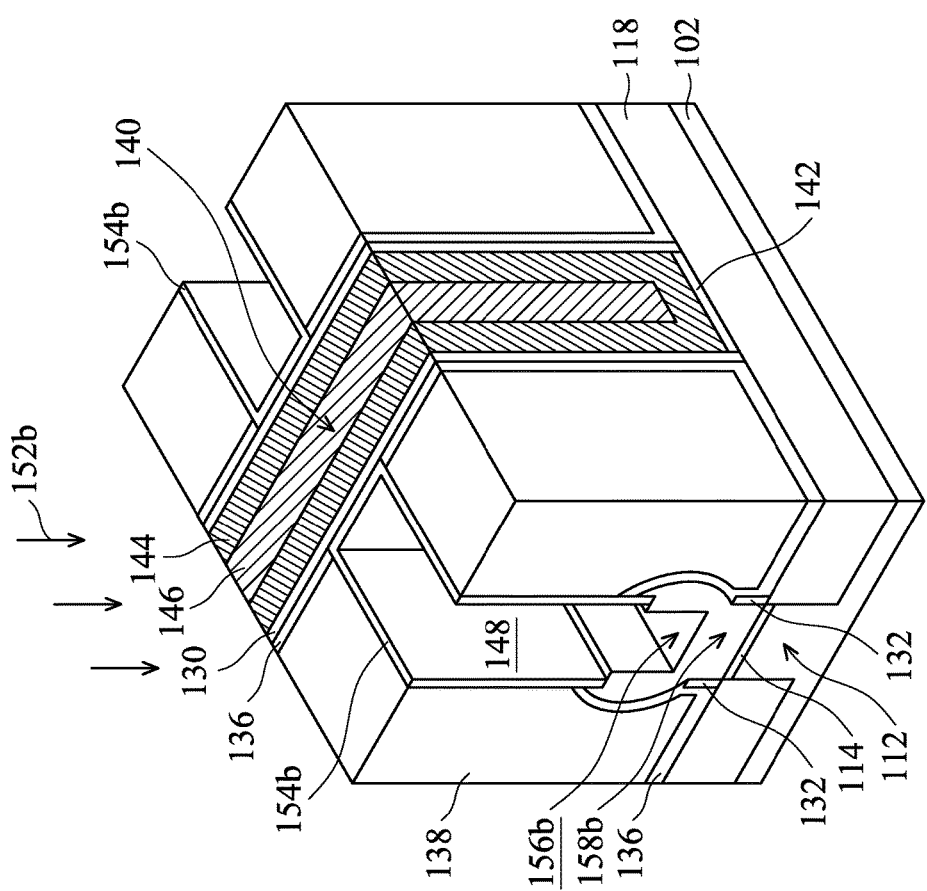
FIGS. 3A and 3B are perspective views of various stages of forming a semiconductor structure in accordance with some embodiments.
Figure 3B:
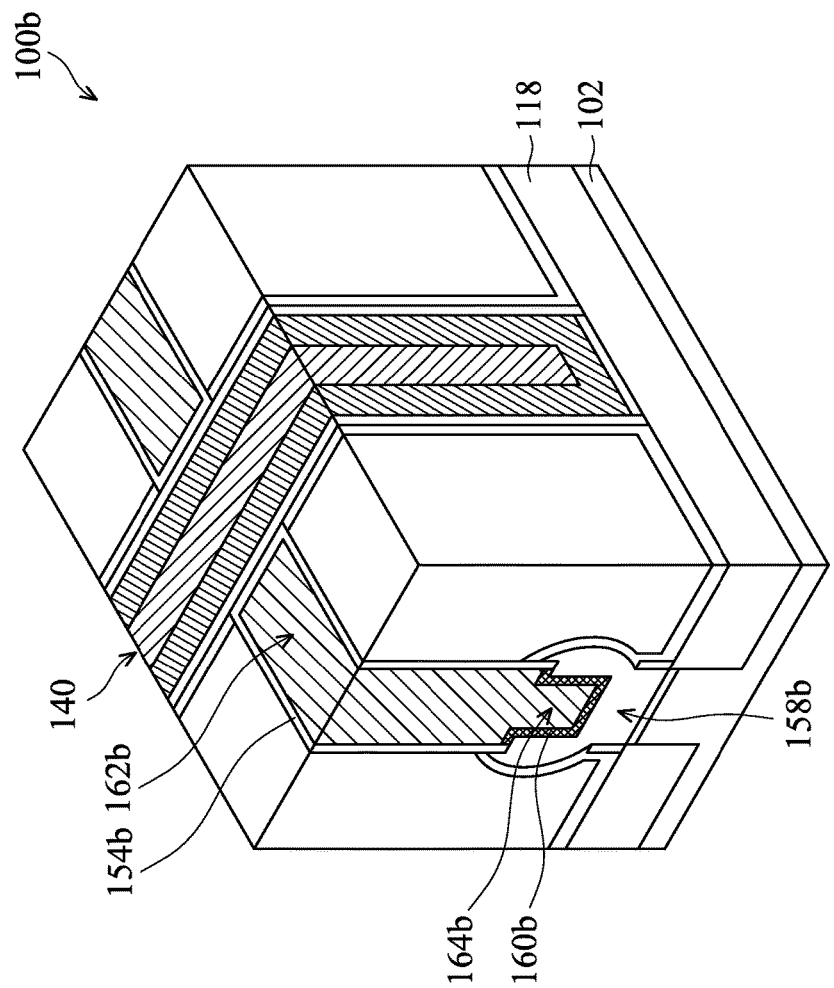

FIGS. 3A and 3B are perspective views of various stages of forming a semiconductor structure 100b in accordance with some embodiments. Semiconductor structure 100b is similar to semiconductor structure 100a, but semiconductor structure 100b is an n-type metal-oxide-semiconductor (NMOS) structure and the extending portion of its contact has a greater thickness. Some methods and materials used to form semiconductor structure 100b may be similar to, or the same as, those used to form semiconductor structure 100a shown in FIGS. 1A to 1Q and described previously and are not repeated herein.

Processes shown in FIGS. 1A to 1O may be performed. Next, a second etching process 152b is performed, as shown in FIG. 3A in accordance with some embodiments. During second etching process 152b, contact spacer layer 150 (not shown in FIG. 3A, referring to FIG. 1O) is etched to form second contact spacer 154b, and source/drain structure 134 is etched to form a second recess 156b in a recessed source/drain structure 158b, as shown in FIG. 3A in accordance with some embodiments. In some embodiments, source/drain structures 134 includes P as a dopant in a concentration of about $5\times10^{20}$ atoms/cm$^3$ to about $2\times10^{21}$ atoms/cm$^3$.

In some embodiments, second etching process 152b is a dry etching process. Second etching process 152b may be similar to first etching process 152a, but second etching process 152b may be performed for a longer time than first etching process 152a is. Accordingly, the depth of second recess 156b is greater than the depth of first recess 156a in accordance with some embodiments. In some embodiments, the depth of second recess 156b is about twice of the depth of first recess 156a.

Since second etching process 152b may be performed for a longer time than first etching process 152a, the amount of contact spacer layer 150 etched during second etching process 154b may be greater than the amount of contact spacer layer 150 etching during first etching process 154a. Therefore, the resulting first contact spacer 154a is thicker than second contact spacer 154b in accordance with some embodiments. In some embodiments, the thickness of first contact spacer 154a is about twice of the thickness of second contact spacer 154b.

After second recess 154b is formed in second recessed source/drain region 158b, a second silicide layer 160b is formed over second recess 154b, as shown in FIG. 3B in accordance with some embodiments. The method and materials used to form second silicide layer 160b may be similar to those used to form first silicide layer 160a described previously and are not repeated herein.

After second silicide layer 160b is formed, a second contact 162b is formed over second recessed source/drain region 158b, as shown in FIG. 3B in accordance with some embodiments. The method and materials used to form second contact 162b may be similar to those used to form first contact 162a described previously and are not repeated herein.

Figure 4:
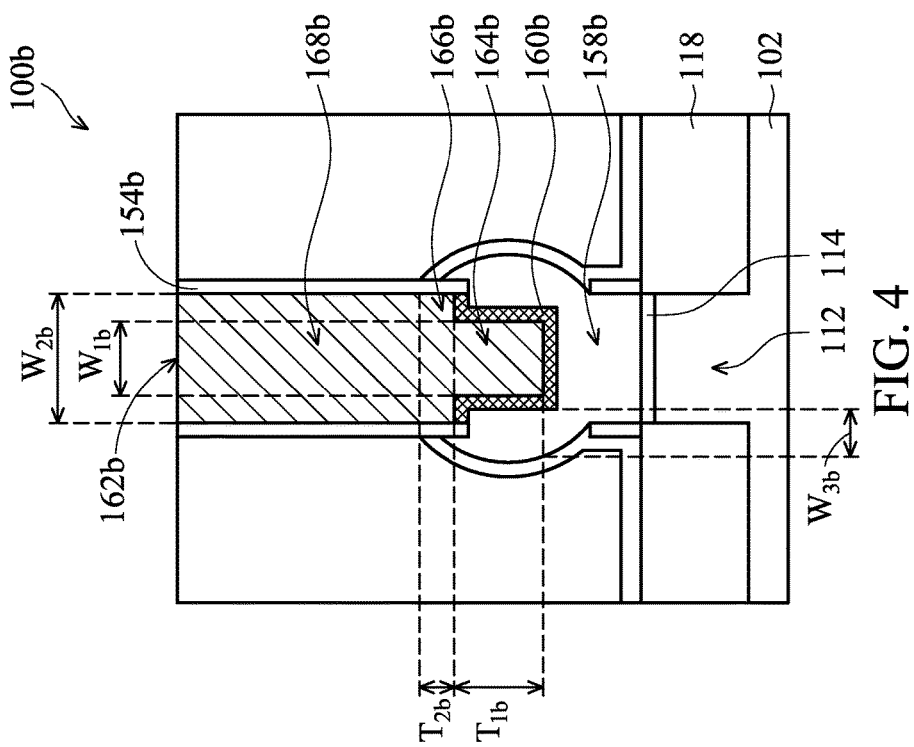
FIG. 4 is a cross-sectional representation of the semiconductor structure shown in FIG. 3B in accordance with some embodiments.

FIG. 4 is a cross-sectional representation of semiconductor structure 100b shown in FIG. 3B in accordance with some embodiments. As shown in FIG. 4, second contact 162b is formed over recessed source/drain structure 158b, and second contact 162b includes second extending portion 164b formed in second recess 156b. In addition, second contact 162b further includes a second middle portion 166b formed in the portion of trench 148 extending into recessed source/drain structure 158b and a second top portion 168b positioned over second middle portion 168b.

In some embodiments, second extending portion 164b of second contact 162b has a thickness $T_{1b}$ in a range from about 23 nm to about 65 nm. In some embodiments, second middle portion 166b of second contact 162b has a thickness $T_{2b}$ in a range of about 3 nm to about 15 nm. In some embodiments, the difference between thickness $T_{1b}$ and thickness $T_{2b}$ is in a range from about 20 nm to about 50 nm.

In some embodiments, second extending portion 164b of second contact 162b has a width $W_{1b}$ in a range from about 5 nm to about 19 nm. In some embodiments, second middle portion 166b of second contact 162b has a width $W_{2b}$ in a range of about 6 nm to about 20 nm. In some embodiments, the difference between width $W_{1b}$ and width $W_{2b}$ is in a range from about 1 nm to about 8 nm. In some embodiments, the width of second top portion 168b of second contact 162b is substantially equal to the width $W_{2b}$ of second middle portion 166b.

Furthermore, as shown in FIG. 4, a portion of recessed source/drain structure 158b is positioned beside second extending portion 164b of second contact 162b. In some embodiments, the portion of recessed source/drain structure 158b positioned beside the bottom surface of second extending portion 164b has a width $W_3b$ in a range from about 2 nm to about 10 nm. As described previously, second contact spacer 154b is formed to protect some portions of source/drain structure 134 so that the size of the resulting recessed source/drain structure 158b can be better controlled.

It should be noted that, although semiconductor structures 100a and 100b are shown in different figures, they may be formed in the same semiconductor device. For example, semiconductor structure 100a shown in FIG. 1Q may be a PMOS region and semiconductor structure 100b shown in FIG. 3B may be an NMOS region in a semiconductor device.

In some embodiments, the processes shown in FIGS. 1A to 1O are performed to form two regions, such as an NMOS region and a PMOS region. Next, first etching process 152a is performed on the PMOS region to form first recess 156a, while a photoresist layer is formed over the NMOS region to protect the NMOS region during first etching process 152a. Afterwards, second etching process 152b is performed on the NMOS region to form second recess 156b, while a photoresist layer is formed over the PMOS region to protect the PMOS region during second etching process 152b. After first recess 156a and second recess 156b are formed, first contact 162a and second contact 162b are respectively formed over recessed source/drain structure 158a and recessed source/drain structure 158b, as shown in FIGS. 1Q and 3B in accordance with some embodiments.

As described previously, first silicide layer 160a and second silicide layer 160b are formed over the bottom surface and the sidewalls of first recess 156a and second recess 156b. Therefore, first silicide layer 160a and second silicide layer 160b each has a profile with a step-like shape, including substantially vertical parts and substantially horizontal parts. Therefore, first extending portion 164a and second extending portion 164b can be surrounded by first silicide layer 160a and second silicide layer 160b. Accordingly, the surfaces of first silicide layer 160a and second silicide layer 160b that are in contact with first contact 162a and second contact 162b are relatively large, and therefore the resistance of semiconductor structures 100a and 100b can be reduced.

However, for a PMOS structure, such as semiconductor structure 100b, the extending portion of the contact should not be too thick, or the strain in the source/drain structure may be too small. Therefore, first etching process 152a may be performed for a shorter time than second etching process 152b, so that the depth of first recess 156a is smaller than the depth of second recess 156b in accordance with some embodiments. Accordingly, the thickness $T_{1a}$ of first extending portion 164a is smaller than the thickness $T_{1b}$ of second extending portion 164b. In the embodiments described above, gate structure 150 shown in FIG. 1Q is a PMOS gate structure, and gate structure 150 shown in FIG. 3B is an NMOS gate structure.

Figure 5:
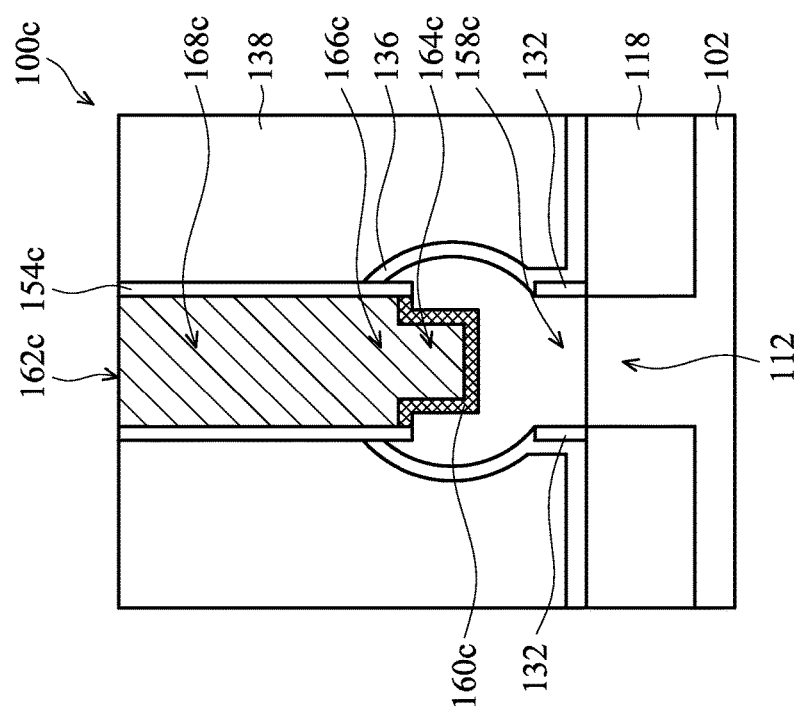
FIG. 5 is a cross-sectional representation of a semiconductor structure in accordance with some embodiments.

FIG. 5 is a cross-sectional representation of a semiconductor structure 100c in accordance with some embodiments. Semiconductor structure 100c may be the same as semiconductor structures 100a and 100b, except $SiGeO_x$ layer 114 is not formed in semiconductor structure 100c. That is, semiconductor structure 100c also includes fin structure 112 formed over substrate 102, and a gate structure (not shown) formed across fin structure 112. In addition, a recessed source/drain structure 158c is formed in fin structure 112, and a third contact 162c is formed over recessed source/drain structure 158c. Furthermore, third contact 162c has a third extending portion 134c, which is surrounded by a third silicide layer 160c.

FIGS. 6A to 6F are perspective views of various stages of forming a semiconductor structure 100d in accordance with some embodiments. Semiconductor structure 100d is similar to semiconductor structures 100a or 100b, except the gate structure is formed across two fin structures. Some methods and materials used to form semiconductor structure 100d may be similar to, or the same as, those used to form semiconductor structures 100a or 100b described previously and are not repeated herein.

Figure 6A:
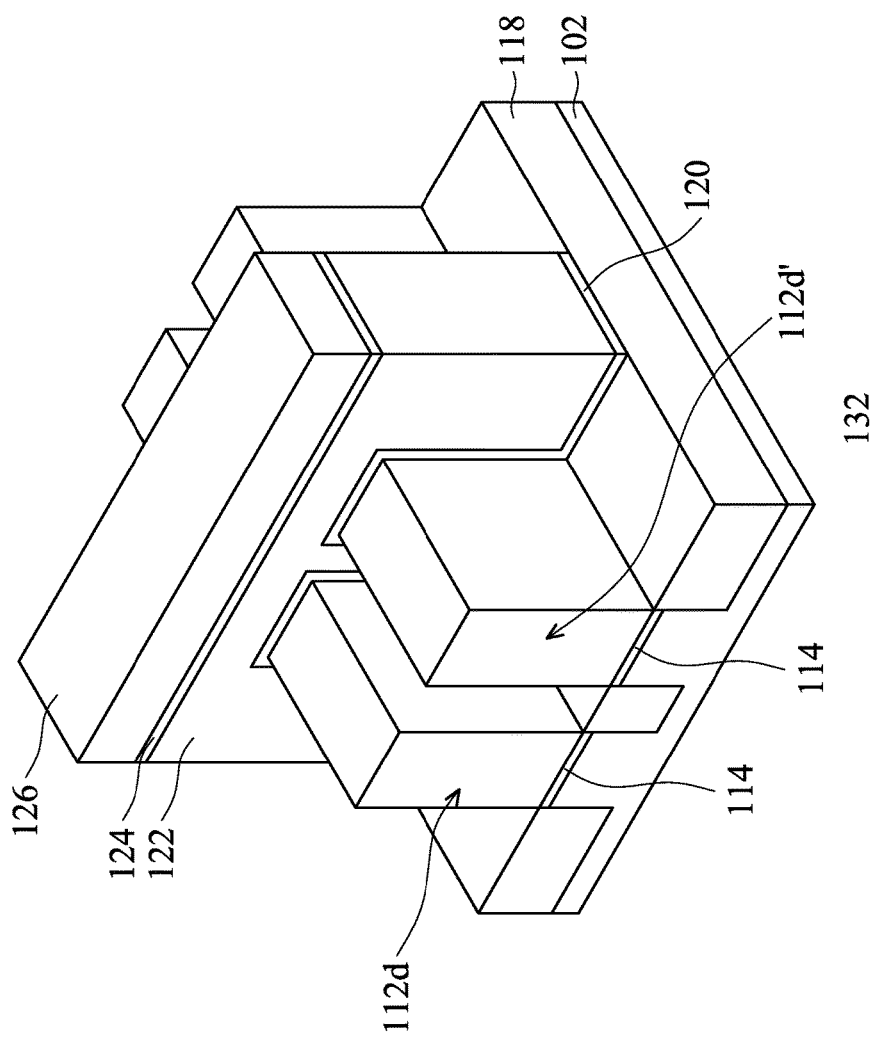
FIGS. 6A to 6F are perspective views of various stages of forming a semiconductor structure in accordance with some embodiments.

As shown in FIG. 6A, a first fin structure 112d and a second fin structure 112d' are formed over substrate 102, and first fin structure 112d and second fin structure 112d' include $SiGeO_x$ layer 114 in accordance with some embodiments. In some embodiments, the distance between first fin structure 112d and second fin structure 112d' is in a range from about 20 nm to about 40 nm. Isolation structure 118 is formed over substrate 102 and is positioned around first fin structure 112d and second fin structure 112d'.

In addition, dummy gate structure 122 is formed across first fin structure 112d and second fin structure 112d' and extends over isolation structure 118. Gate dielectric layer 120 is positioned below dummy gate structure 122, and dielectric layer 124 and mask layer 110 are formed over dummy gate structure 122 in accordance with some embodiments.

Figure 6B:
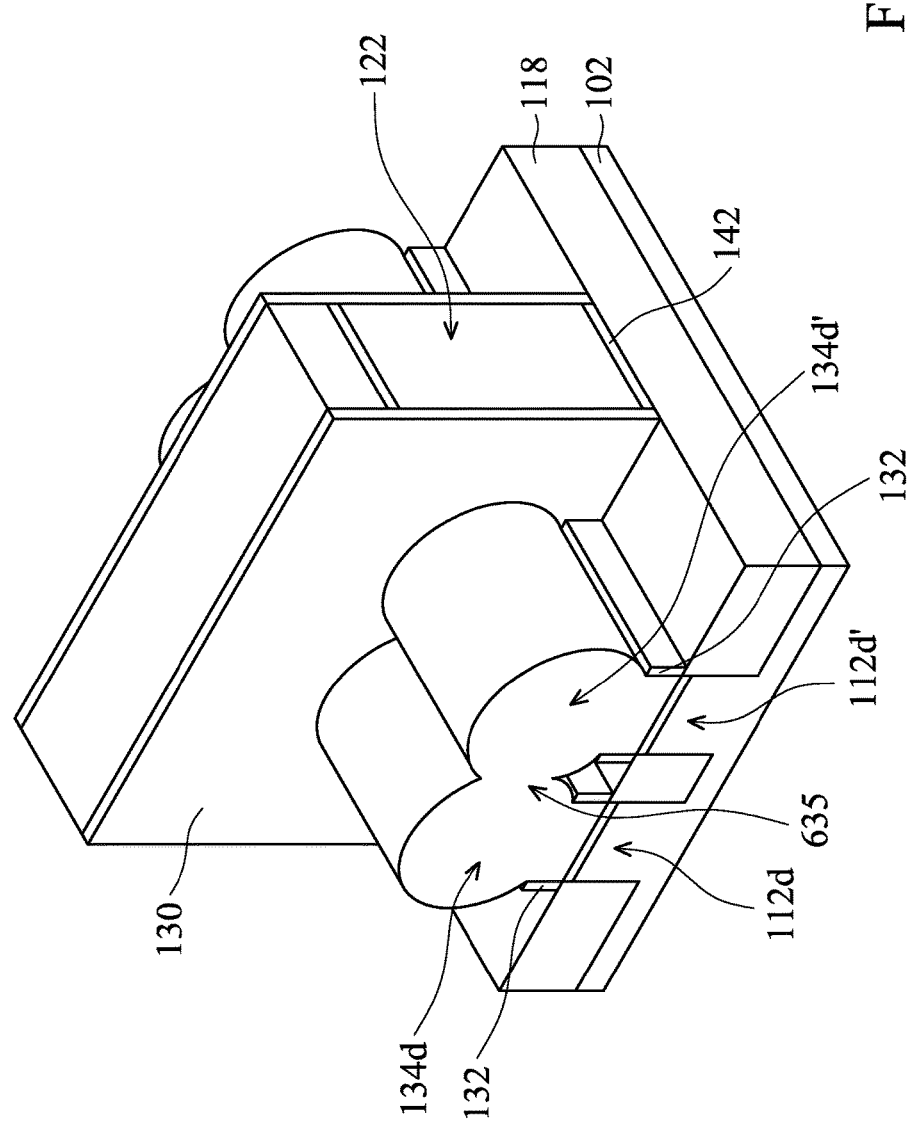

Next, gate spacers 130 and fin spacers 132 are formed, and first source/drain structures 134d and second source/drain structure 134d' are formed in first fin structure 112d and second fin structure 112d', as shown in FIG. 6B in accordance with some embodiments. The formation of first source/drain structures 134d and second source/drain structure 134d' may be similar to that of source/drain structure 134 described previously. For example, first source/drain structures 134d and second source/drain structure 134d' may be formed by recessing first fin structure 112d and second fin structure 112d' to form recesses and growing a strained material in the recesses. However, during the process for growing the strained material, the strain material formed in first fin structure 112d and the strained material formed in second fin structure 112d' may be merged with each other. Therefore, the resulting first source/drain structures 134d and second source/drain structure 134d' may be merged to form a connected structure. As shown in FIG. 6B, first source/drain structures 134d and second source/drain structure 134d' have a merged portion 635 in accordance with some embodiments. Merged portion 635 of first source/drain structures 134d and second source/drain structure 134d' provides a larger window for forming a contact over it in subsequent processes (Further details will be described later.)

Figure 6C:
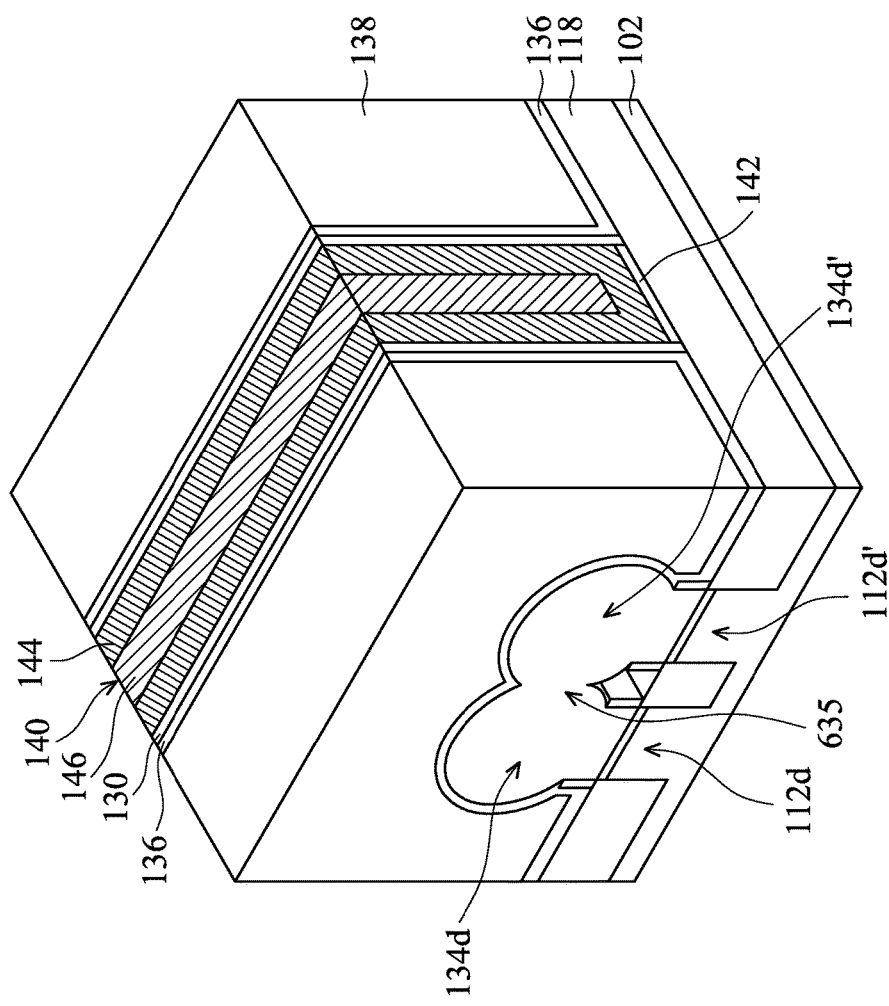

After first source/drain structures 134d and second source/drain structure 134d' are formed, contact etch stop layer 136 is formed over substrate 102, and an inter-layer dielectric (ILD) layer 138 is formed over contact etch stop layer 126, as shown in FIG. 6C in accordance with some embodiments. As described previously, some portions of recessed first source/drain structure 134d and recessed second source/drain structure 134d' are merged with each other in accordance with some embodiments. Therefore, when contact etch stop layer 136 and inter-layer dielectric layer 138 are formed, they may be formed to cover recessed first source/drain structure 134d and recessed second source/drain structure 134d' but are not formed in the region below merged portion 635. That is, a void is formed below merged portion 635 of recessed first source/drain structure 134d and recessed second source/drain structure 134d'.

After contact etch stop layer 136 and inter-layer dielectric layer 138 are formed, dummy gate structure 122 is replaced by gate structure 140, which includes gate dielectric layer 142, work function metal layer 144, and gate electrode layer 146 in accordance with some embodiments.

Figure 6D:
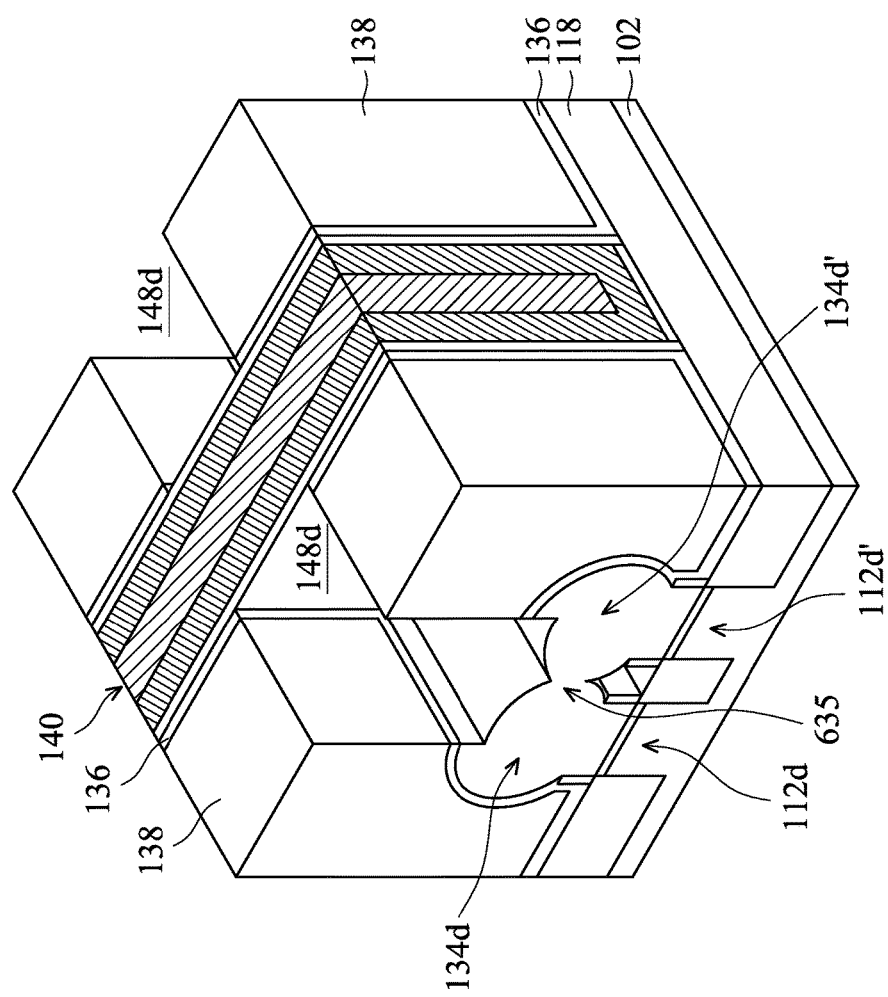
Figure 6E:
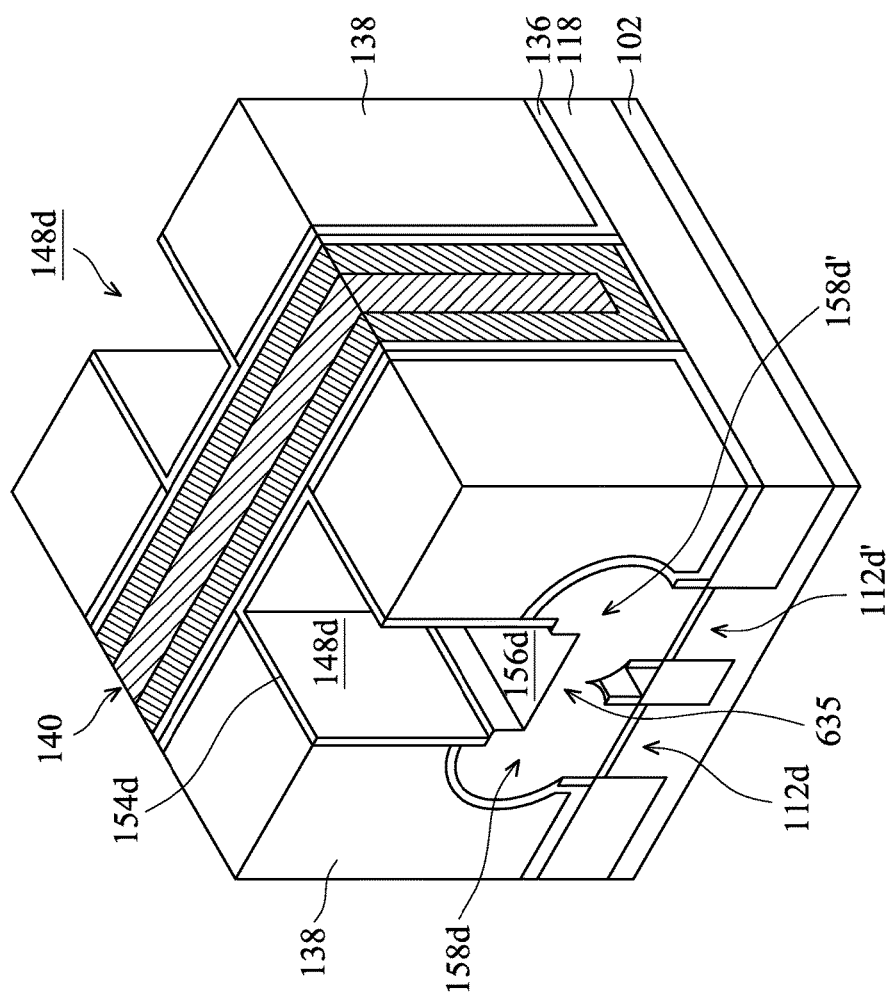

Next, a trench 148d is formed in interlayer dielectric layer 138, as shown in FIG. 6D in accordance with some embodiments. In some embodiments, trench 148d is formed by etching a portion of interlayer dielectric layer 138 to form a trench over merged portion 635 of first source/drain structures 134d and second source/drain structure 134d'. In some embodiments, a portion of merged portion 635 of first source/drain structures 134d and second source/drain structure 134d' is also removed, such that trench 148d extends into merged portion 635 of first source/drain structures 134d and second source/drain structure 134d'.

As described previously, since first source/drain structures 134d and second source/drain structure 134d' has merged portion 635, the alignment of forming a contact over first source/drain structures 134d and second source/drain structure 134d' can have a larger forming window. Therefore, risks of alignment failure may be reduced. In addition, it is not necessary to form contacts on each source/drain structure, and therefore the manufacturing process may be simplified.

After trench 148d is formed, contact spacer 154d is formed on the sidewalls of trench 148d, and a recess 156d is formed in a recessed first source/drain structure 158d and a recessed second source/drain structure 158d', as shown in FIG. 16E in accordance with some embodiments. In addition, recess 156d is positioned over merged portion 635 in accordance with some embodiments.

Figure 6F:
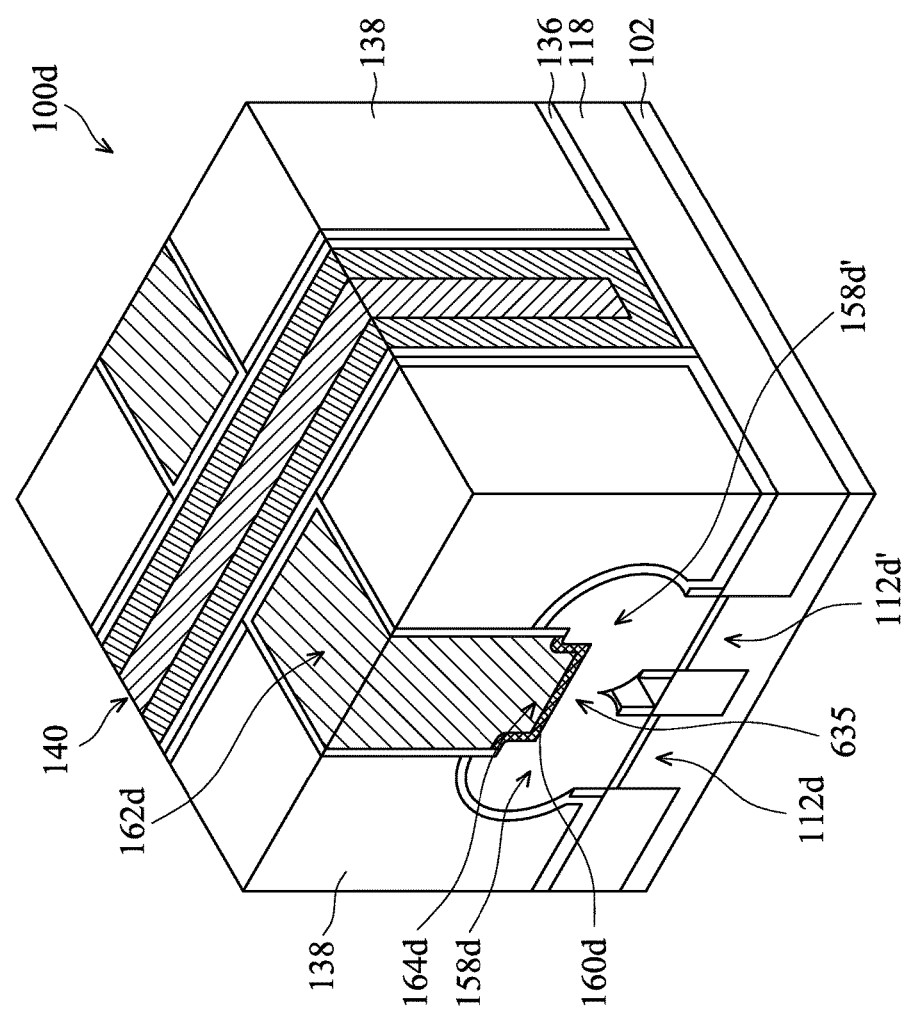

After recess 156d is formed, a silicide layer 160d and a contact 162d are formed over merged portion 635 of recessed first source/drain structure 158d and recessed second source/drain structure 158d', as shown in FIG. 6F in accordance with some embodiments. Silicide layer 160d and contact 162d may be formed by processes that are similar to, or the same as, those used to form first silicide layer 160a and first contact 162a and are not repeated herein.

Figure 7:
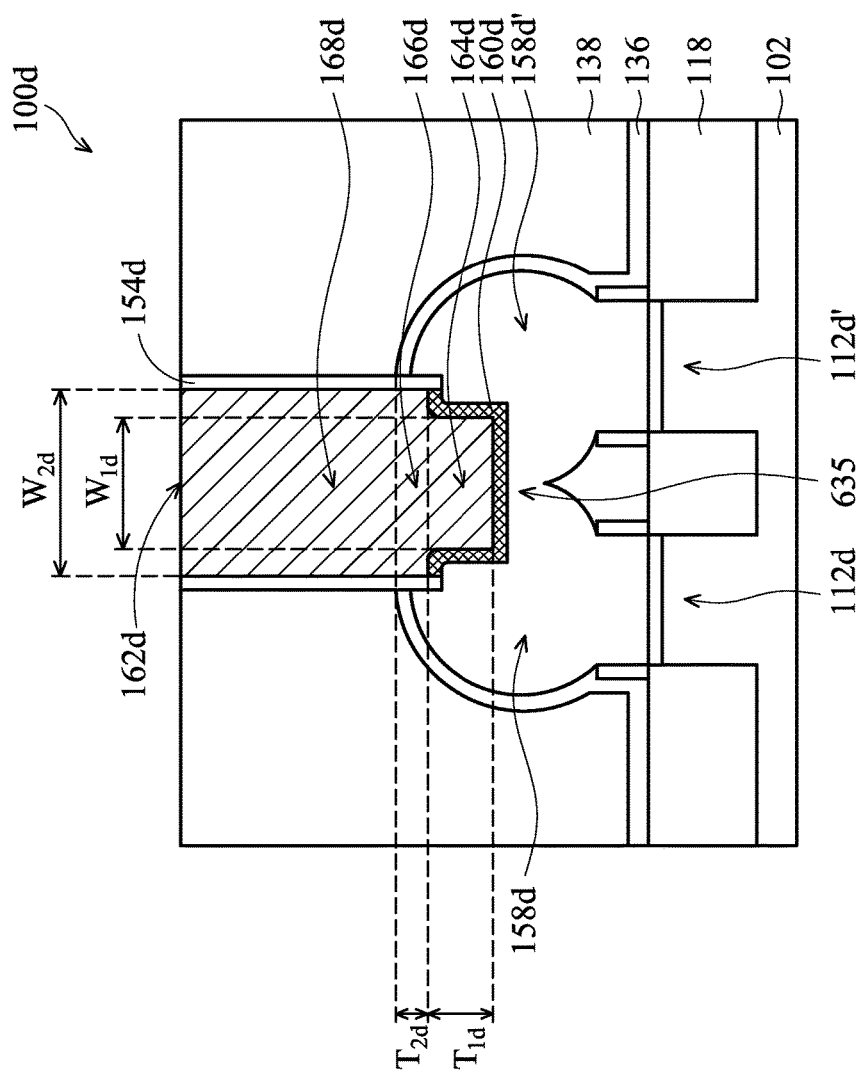
FIG. 7 is a cross-sectional representation of the semiconductor structure shown in FIG. 6F in accordance with some embodiments.

FIG. 7 is a cross-sectional representation of semiconductor structure 100d shown in FIG. 6F in accordance with some embodiments. Similar to that of semiconductor structure 100a described previously, the bottom surface of contact spacer 154d is substantially level with the bottom surface of trench 148d. Accordingly, a portion of contact spacer 154d also extends into recessed first source/drain structure 158d and recessed second source/drain structure 158d' in accordance with some embodiments. In addition, contact 162d includes extending portion 164d, a middle portion 166d formed in the portion of trench 148d extending into recessed first source/drain structure 158d and recessed second source/drain structure 158d', and a top portion 168d positioned over middle portion 168d.

In some embodiments, semiconductor structure 100d is a PMOS structure. In these embodiments, the thickness $T_{1d}$ of extending portion 164d and the thickness $T_{2d}$ of middle portion 166d are similar to, or the same as, the thickness $T_{1a}$ of first extending portion 164a and the thickness $T_{2a}$ of first middle portion 166a described previously. In addition, the width $W_{1d}$ of extending portion 164d and the width $W_{2d}$ of middle portion 166d (of top portion 168d) are similar to, or the same as, the width $W_{1a}$ of first extending portion 164a and the width $W_{2a}$ of first middle portion 166a described previously in accordance with some embodiments.

In some embodiments, semiconductor structure 100d is an NMOS structure. In these embodiments, the thickness $T_{1d}$ of extending portion 164d and the thickness $T_{2d}$ of middle portion 166d are similar to, or the same as, the thickness $T_{1b}$ of second extending portion 164b and the thickness $T_{2b}$ of second middle portion 166b described previously. In addition, the width $W_{1d}$ of extending portion 164d and the width $W_{2d}$ of middle portion 166d (of top portion 168d) are similar to, or the same as, the width $W_{1b}$ of second extending portion 164b and the width $W_{2b}$ of second middle portion 166b described previously in accordance with some embodiments.

As shown in FIG. 7, middle portion 166d and extending portion 164a of first contact 162d form a structure with a step-like shape in recessed first source/drain structure 158d and recessed second source/drain structure 158d'. Accordingly, silicide layer 160d, positioned over the step-like structure, can have a relatively large contact area, and performance can therefore be improved.

Figure 8A:
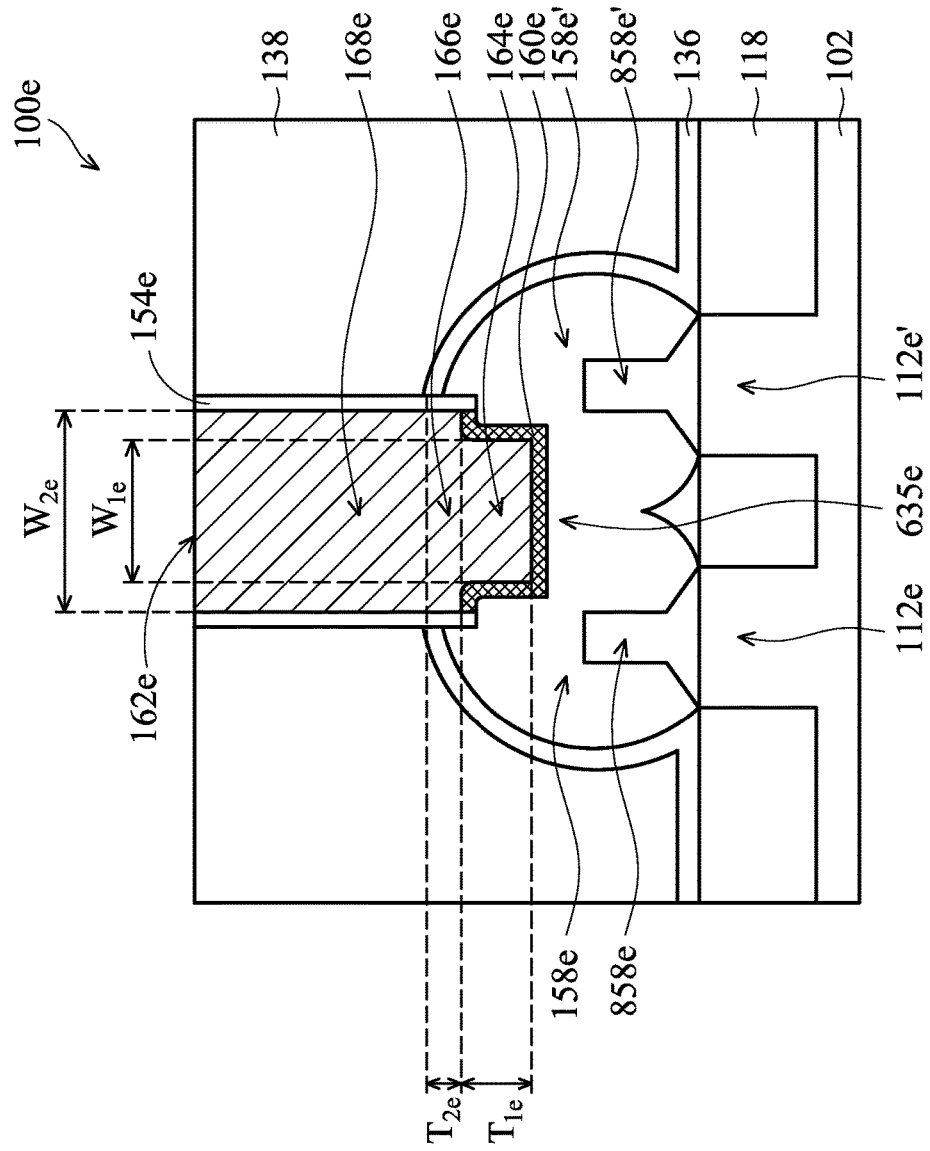
FIGS. 8A and 8B are cross-sectional representations of semiconductor structures in accordance with some embodiments.
Figure 8B:
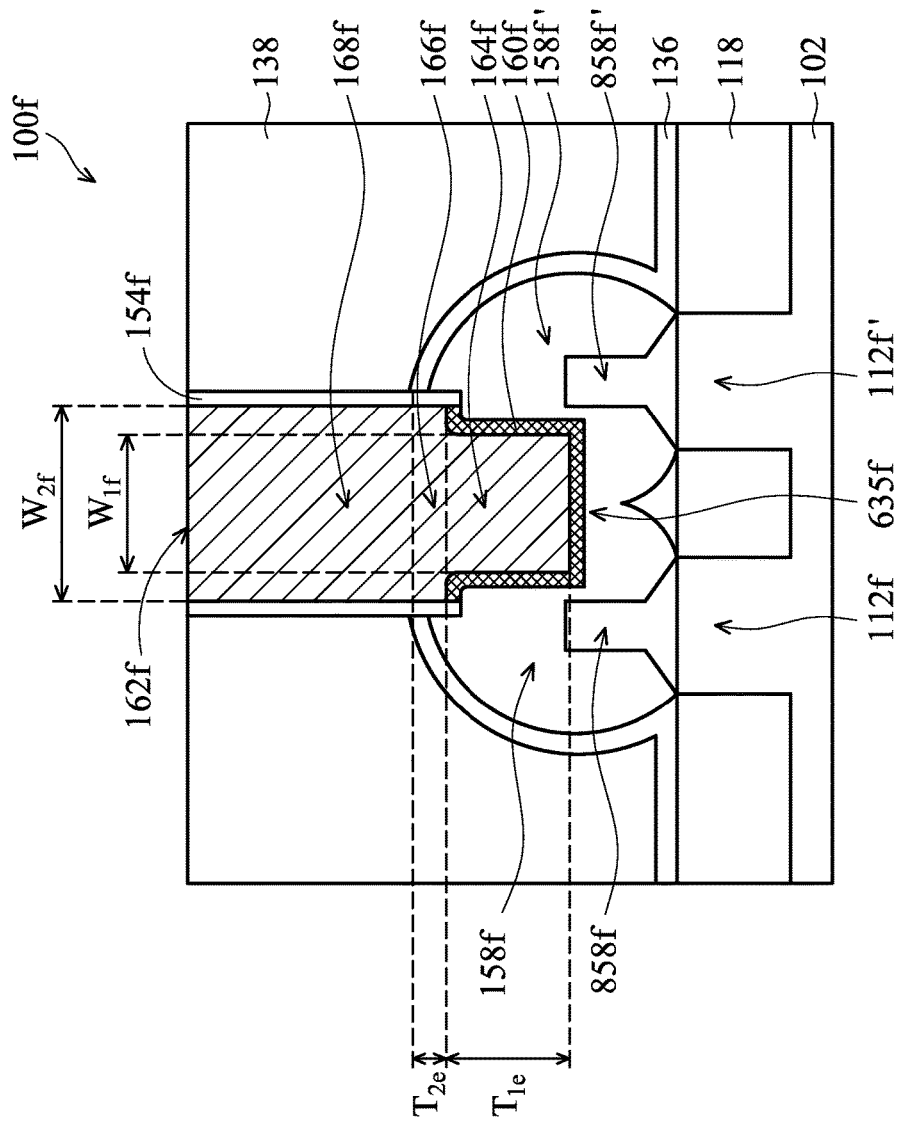

FIGS. 8A and 8B are cross-sectional representations of semiconductor structures 100e and 100f in accordance with some embodiments. Semiconductor structures 100e and 100f are similar to semiconductor structure 100d described previously, except the source/drain structures in semiconductor structures 100e and 100f includes fin strips and strained materials formed around the fin strips. Some methods and materials used to form semiconductor structures 100e and 100f may be similar to, or the same as, those described previously and are not repeated herein.

In some embodiments, semiconductor structure 100e is a PMOS structure, and semiconductor structure 100f is an NMOS structure. In some embodiments, semiconductor structure 100e includes a first fin structure 112e and a second fin structure 112e' formed over substrate 102. A recessed first source/drain structure 158e and a recessed second source/drain structure 158e' are formed over first fin structure 112e and second fin structure 112e' respectively. In some embodiments, recessed first source/drain structure 158e and a recessed second source/drain structure 158e' include fin strips 858e as center portions and strained materials formed over fin strips 858e. As shown in FIG. 8A, fin strips 858e are completely covered by the strain materials. In some embodiments, the strain material formed around fin strips 858e include SiGe, and Ge in the strain material at a concentration in a range from about 20% to about 50%.

In addition, recessed first source/drain structure 158e and recessed second source/drain structure 158e' has a merged portion 635e positioned between them. Contact 162e is formed over merged portion 635e of recessed first source/drain structure 158e and recessed second source/drain structure 158e' in accordance with some embodiments. Contact 162e includes an extending portion 164e, a middle portion 166e, and a top portion 168e.

In some embodiments, the thickness $T_{1e}$ of extending portion 164e and the thickness $T_{2e}$ of middle portion 166e are similar to, or the same as, the thickness $T_{1a}$ of first extending portion 164a and the thickness $T_{2a}$ of first middle portion 166a described previously. In addition, the width $W_{1e}$ of extending portion 164d and the width $W_{2e}$ of middle portion 166e (of top portion 168e) are similar to, or the same as, the width $W_{1a}$ of first extending portion 164a and the width $W_{2a}$ of first middle portion 166a described previously in accordance with some embodiments.

Similarly, semiconductor structure 100f includes a first fin structure 112f and a second fin structure 112f' formed over substrate 102 in accordance with some embodiments. A recessed first source/drain structure 158f and a recessed second source/drain structure 158f' are formed over first fin structure 112f and second fin structure 112f' respectively. In some embodiments, recessed first source/drain structure 158f and a recessed second source/drain structure 158f' include fin strips 858f as center portions and strained materials formed over fin strips 858f. As shown in FIG. 8B, fin strips 858f are completely covered by the strain materials.

In addition, recessed first source/drain structure 158f and recessed second source/drain structure 158f' has a merged portion 635f positioned between them. Contact 162f is formed over merged portion 635f of recessed first source/drain structure 158f and recessed second source/drain structure 158f' in accordance with some embodiments. Contact 162f includes an extending portion 164f, a middle portion 166f, and a top portion 168f.

In some embodiments, the thickness $T_{1f}$ of extending portion 164f and the thickness $T_{2f}$ of middle portion 166f are similar to, or the same as, the thickness $T_{1f}$ of second extending portion 164f and the thickness $T_{2f}$ of second middle portion 166f described previously. In addition, the width $W_{1f}$ of extending portion 164f and the width $W_{2f}$ of middle portion 166f (of top portion 168f) are similar to, or the same as, the width $W_{1f}$ of second extending portion 164f and the width $W_{2f}$ of second middle portion 166f described previously in accordance with some embodiments.

As shown in FIGS. 8A and 8B, extending portion 164e in the PMOS structure is thinner than extending portion 164f in the NMOS structure. In some embodiments, extending portion 164e does not extend to a position lower than the top surface of fin strips 858e, while a portion of extending portion 164f extends to a position lower than the top surface of fin strips 858f.

As described previously, a semiconductor structure (e.g. semiconductor structures 100a to 100f) includes a contact having an extending portion (e.g. 164a to 164f) formed in recessed source/drain structure (e.g. 158a to 158f). In addition, the extending portion is surrounded by a silicide layer (e.g. 160a to 160f). The silicide layer may have a step-like profile, such that the silicide layer can have a relatively large contact surface with the contact, and therefore the performance if the semiconductor structure can be improved.

It should be noted that the singular forms "a", "an", and "the" described above may include plural referents, unless the context clearly dictates otherwise. In addition, when the word "about" is used herein, this is intended to mean that the nominal value presented is precise within ±10% in accordance with some embodiments.

Embodiments of a semiconductor structure and methods for forming the semiconductor structures are provided. The semiconductor structure includes a fin structure formed over a substrate, and a gate structure formed over the fin structure. A source/drain structure formed in the fin structure and is positioned adjacent to the gate structure. A contact formed over the source/drain structure, and an extending portion extending into the source/drain structure. A silicide layer positioned between the contact and the source/drain structure, the extending portion of the contact is surrounded by the silicide layer. Therefore, the contact surface between the silicide layer and the contact is relatively large, and therefore the performance of the semiconductor structure is improved.

In some embodiments, a semiconductor structure is provided. The semiconductor structure includes a fin structure formed over a substrate and a first gate structure formed across the fin structure. The semiconductor structure further includes a first source/drain structure formed in the fin structure adjacent to the first gate structure and a first contact formed over the first source/drain structure. In addition, the first contact includes a first extending portion extending into the first source/drain structure.

In some embodiments, a semiconductor structure is provided. The semiconductor structure includes a fin structure formed over a substrate and a gate structure formed across the fin structure. The semiconductor structure further includes a first source/drain structure formed in the fin structure adjacent to the gate structure and a contact formed over the first source/drain structure. In addition, the contact includes an extending portion extending into the source/drain structure. The semiconductor structure further includes a silicide layer positioned on sidewalls and bottom surface of the extending portion of the contact In some embodiments, a method for manufacturing a semiconductor structure is provided. The method for manufacturing a semiconductor structure includes forming a first fin structure over a substrate and forming a first gate structure across the first fin structure over a substrate. The method for manufacturing a semiconductor structure further includes forming a first source/drain structure in the first fin structure adjacent to the first gate structure and forming a first recess in the first source/drain structure. The method for manufacturing a semiconductor structure further includes forming a first silicide layer at a bottom surface and sidewalls of the first recess and forming a first contact over the first silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin structure formed over a substrate;
   a first gate structure formed across the fin structure;
   a first source/drain structure formed in the fin structure adjacent to the first gate structure;
   a first contact formed over the first source/drain structure, wherein the first contact comprises a first top portion and a first extending portion extending into the first source/drain structure; and
   a first silicide layer located on a bottom surface of the first top portion of the first contact and a bottom surface and sidewalls of the first extending portion of the first contact, wherein the bottom surface of the first top portion of the first contact is substantially parallel with a bottommost surface of the first silicide layer.

2. The semiconductor structure as claimed in claim 1, further comprising:
   a first contact spacer formed around the first contact.

3. The semiconductor structure as claimed in claim 2, wherein a portion of the first contact spacer extends into the first source/drain structure.

4. The semiconductor structure as claimed in claim 1, further comprising:
   a second gate structure formed over the substrate;
   a second source/drain structure formed adjacent to the second gate structure; and
   a second contact formed over the second source/drain structure, and the second contact comprises a second extending portion extending into the second source/drain structure,
   wherein a thickness of the first extending portion of the first contact is smaller than a thickness of the second extending portion of the second contact, and
   wherein the first gate structure is an n-type metal-oxide-semiconductor gate structure, and the second gate structure is a p-type metal-oxide-semiconductor gate structure.

5. The semiconductor structure as claimed in claim 1, wherein a bottommost surface of the first extending portion of the first contact is fully covered by the first silicide layer.

6. A semiconductor structure, comprising:
   a fin structure formed over a substrate;
   a gate structure formed across the fin structure;
   a first source/drain structure formed in the fin structure adjacent to the gate structure;
   a contact formed over the first source/drain structure, and the contact comprises a top portion and an extending portion extending into the source/drain structure;
   a silicide layer positioned on sidewalls and bottom surface of the extending portion of the contact; and
   a contact spacer formed on a sidewall of the contact, wherein an inner side of the contact spacer facing the contact is in direct contact with the silicide layer, and an outer side of the contact spacer opposite to the inner side is in direct contact with the first source/drain structure.

7. The semiconductor structure as claimed in claim 6, wherein a width of the top portion of the contact is greater than a width of the extending portion of the contact.

8. The semiconductor structure as claimed in claim 6, further comprising:
   a second source/drain structure formed adjacent to the gate structure,
   wherein the first source/drain structure and the second source/drain structure has a merged portion, and the contact is formed over the merged portion.

9. The semiconductor structure as claimed in claim 6, wherein the contact spacer is not formed on a bottom surface of the contact.

10. The semiconductor structure as claimed in claim 6, wherein the contact spacer is not formed on a sidewall of the extending portion of the contact.

11. The semiconductor structure as claimed in claim 6, wherein a portion of the first source/drain structure covers a portion of the contact spacer.

12. The semiconductor structure as claimed in claim 6, further comprising:
    a fin strip at a center portion of the first source/drain structure.

13. The semiconductor structure as claimed in claim 6, wherein the silicide layer has a step structure.

14. A method for manufacturing a semiconductor structure, comprising:
    forming a first fin structure over a substrate;
    forming a first gate structure across the first fin structure over a substrate;
    forming a first source/drain structure in the first fin structure adjacent to the first gate structure;
    forming an interlayer dielectric layer over the substrate to cover the first source/drain structure;
    forming a first trench in the interlayer dielectric layer to expose a top surface of the first source/drain structure;
    forming a first contact spacer layer over sidewalls of the first trench and covering the top surface of the first source/drain structure;
    etching through a portion of the first contact spacer layer to form a contact spacer and to expose a portion of the top surface of the first source/drain structure covered by the first contact spacer layer and etching a portion of the first source/drain structure to form a first recess in the first source/drain structure; and
    forming a first contact in the first recess and the first trench.

15. The method for manufacturing a semiconductor structure as claimed in claim 14, wherein the first contact comprises a first extending portion formed in the first recess and is surrounded by a first silicide layer.

16. The method for manufacturing a semiconductor structure as claimed in claim 14, further comprising
    forming a second fin structure over the substrate;
    forming a second gate structure across the second fin structure;
    forming a second source/drain structure in the second fin structure adjacent to the second gate structure;
    forming a second recess in the second source/drain structure;
    forming a second silicide layer at a bottom surface and sidewalls of the second recess; and
    forming a second contact over the second source/drain structure,
    wherein the second contact comprises a second extending portion formed in the second recess.

17. The method for manufacturing a semiconductor structure as claimed in claim 16, wherein a depth of the first recess is smaller than a depth of the second recess.

18. The method for manufacturing a semiconductor structure as claimed in claim 14, wherein a width of the first trench is greater than a width of the first recess.

19. The method for manufacturing a semiconductor structure as claimed in claim 14, wherein a bottom surface of the first recess is lower than a bottom end of the first contact spacer.

20. The method for manufacturing a semiconductor structure as claimed in claim 14, wherein etching through the portion of the first contact spacer layer to form the contact spacer and etching the portion of the first source/drain structure to form the first recess as a whole are performed by a single etching process.

\* \* \* \* \*